United States Patent
Utsunomiya et al.

(10) Patent No.: US 9,560,300 B2
(45) Date of Patent: *Jan. 31, 2017

(54) ANALOG TO DIGITAL CONVERTER FOR SOLID-STATE IMAGE PICKUP DEVICE

(71) Applicant: RENESAS ELECTRONICS CORPORATION, Tokyo (JP)

(72) Inventors: Hiroto Utsunomiya, Tokyo (JP); Katsumi Dosaka, Tokyo (JP); Hiroshi Kato, Tokyo (JP); Fukashi Morishita, Tokyo (JP); Fumiyasu Sasaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/082,913

(22) Filed: Mar. 28, 2016

(65) Prior Publication Data

US 2016/0212367 A1  Jul. 21, 2016

Related U.S. Application Data

(63) Continuation of application No. 14/256,680, filed on Apr. 18, 2014, now Pat. No. 9,300,892, which is a
(Continued)

(30) Foreign Application Priority Data

| Mar. 13, 2009 | (JP) | ................................ 2009-061550 |
| Mar. 13, 2009 | (JP) | ................................ 2009-061551 |
| Sep. 7, 2009 | (JP) | ................................ 2009-205918 |

(51) Int. Cl.
*H04N 5/3745* (2011.01)
*H04N 5/376* (2011.01)
(Continued)

(52) U.S. Cl.
CPC ......... *H04N 5/37455* (2013.01); *H03M 1/144* (2013.01); *H03M 1/403* (2013.01);
(Continued)

(58) Field of Classification Search
CPC ...................... H03M 1/34–1/468; H04N 5/378
See application file for complete search history.

(56) References Cited

U.S. PATENT DOCUMENTS

| 2006/0050162 A1 | 3/2006 | Nakamura |
| 2006/0158541 A1 | 7/2006 | Ichikawa |

(Continued)

FOREIGN PATENT DOCUMENTS

| JP | 2005-027232 A | 1/2005 |
| JP | 2006-352597 A | 12/2006 |

(Continued)

OTHER PUBLICATIONS

Japanese Office Action issued in Japanese Patent Application No. 2009-205918 issued on Feb. 19, 2013, with English translation.
(Continued)

*Primary Examiner* — Paul Berardesca
(74) *Attorney, Agent, or Firm* — McDermott Will & Emery LLP

(57) ABSTRACT

There is provided a solid-state image pickup device including ADCs that can be arranged in a limited space. The potential of a pixel signal outputted through a vertical readout line is held at a node. A plurality of capacitors are capacitively coupled to the node at which the pixel signal is held. The potential of the node is decreased in a stepwise manner by sequentially switching the voltages of the counter electrodes of the capacitors by the control of transistors. A comparator compares the potential of the node with the potential of the dark state of the pixel, and determines the upper bits of a digital value when the potential of the node (Continued)

becomes lower than the potential of the dark state. Following this, the conversion of the lower bits of the digital value is started. Therefore, it is possible to simplify the configuration of each ADC and arrange each ADC in a limited space.

4 Claims, 22 Drawing Sheets

Related U.S. Application Data continuation of application No. 12/722,121, filed on Mar. 11, 2010, now Pat. No. 8,736,732.

(51) Int. Cl.
*H03M 1/66* (2006.01)
*H03M 1/40* (2006.01)
*H03M 1/14* (2006.01)
*H04N 5/378* (2011.01)
*H04N 5/374* (2011.01)

(52) U.S. Cl.
CPC .............. *H03M 1/66* (2013.01); *H04N 5/374* (2013.01); *H04N 5/378* (2013.01); *H04N 5/3765* (2013.01); *H03M 2201/16* (2013.01); *H04N 5/3742* (2013.01)

(56) References Cited

U.S. PATENT DOCUMENTS

| | | |
|---|---|---|
| 2007/0279506 A1 | 12/2007 | Sato |
| 2008/0225145 A1* | 9/2008 | Sonoda ................ H04N 5/3456 348/294 |
| 2008/0239106 A1 | 10/2008 | Sano |
| 2008/0278363 A1 | 11/2008 | Okumura |
| 2009/0026352 A1 | 1/2009 | Shimomura et al. |
| 2009/0040352 A1 | 2/2009 | Kawaguchi |
| 2009/0184857 A1* | 7/2009 | Furuta ................ H03M 1/1215 341/156 |
| 2009/0225211 A1 | 9/2009 | Oike |
| 2009/0261998 A1 | 10/2009 | Chae et al. |
| 2009/0295956 A1 | 12/2009 | Chae et al. |
| 2009/0316034 A1 | 12/2009 | Kusuda |
| 2010/0253821 A1 | 10/2010 | Yamamoto |
| 2011/0013046 A1 | 1/2011 | Hiyama |

FOREIGN PATENT DOCUMENTS

| | | |
|---|---|---|
| JP | 2008-098722 A | 4/2008 |
| WO | 2009/099003 A1 | 8/2009 |

OTHER PUBLICATIONS

Entire Prosecution History of U.S. Appl. No. 12/722,121, filed Mar. 11, 2010 entitled Analog to Digital Converter for Solid-State Image Pickup Device.
Non-Final Office Action dated Jun. 19, 2014, issued in related U.S. Appl. No. 14/256,680.
Final Office Action dated Feb. 18, 2015, issued in related U.S. Appl. No. 14/256,680.
Non-Final Office Action dated Jul. 17, 2015, issued in related U.S Appl. No. 14/256,680.
Notice of Allowance dated Nov. 20, 2015, issued in related U.S Appl. No. 14/256,680.

* cited by examiner

ANALOG TO DIGITAL CONVERTER FOR SOLID-STATE IMAGE PICKUP DEVICE

CROSS-REFERENCE TO RELATED APPLICATIONS

This application is a Continuation application of U.S. Ser. No. 14/256,680, filed Apr. 18, 2014, which is a Continuation application of U.S. Ser. No. 12/722,121, filed Mar. 11, 2010, now U.S. Pat. No. 8,736,732, which claims priority to Japanese Patent Application No. 2009-61551 filed on Mar. 13, 2009, Japanese Patent Application No. 2009-61550 filed on Mar. 13, 2009, and Japanese Patent Application No. 2009-205918 filed on Sep. 7, 2009. The subject matter of each is incorporated herein by reference in entirety.

BACKGROUND OF THE INVENTION

The present invention relates to a solid-state image pickup device incorporating an analog/digital converter (hereinafter referred to as ADC), and in particular, relates to a solid-state image pickup device incorporating an ADC that can be arranged in a limited space.

Although film-type cameras have been mainstream in conventional cameras, digital cameras have recently been replacing them. Further, the enhancement of the image quality of digital cameras is remarkable, and the latest models of digital cameras perform better than film cameras. The types of digital cameras include CCD (Charge Coupled Device) and CMOS (Complementary Metal Oxide Semiconductor) image sensors. In terms of enhancing the performance of cameras, there is increasing attention to the CMOS image sensor in which CMOS devices are more easily mounted.

The CMOS image sensor includes two types of image sensors which are an analog image sensor and a digital image sensor. Although each image sensor has its merits and demerits, there are large expectations for the digital image sensor in terms of data processing speed. Specifically, the use of the digital image sensor enables not only moving image shooting but also various applications in combination with image processing of a subsequent stage.

For example, in the case of photographing at the moment when a ball hits a tennis racket or the close-up face of a child who crosses the finish line running around a playground at an athletic meet, by simply pointing a camera toward it the camera can automatically determine a photo opportunity and automatically trigger the shutter. In order to achieve such processing, it is necessary to transfer a shot image to an image processing IP (Intellectual Property) in an instant and to convert shot information (analog information) into image processing information (digital information).

Under such circumstances, ADCs for digital cameras have been actively researched and developed. The biggest problem with the CMOS image sensor is that the conversion of all pixel information into digital values requires a large amount of data processing. For example, if 10 million pixels are processed simply by one ADC at a typical moving image processing rate of 30 fps (frames per second), one-pixel information needs to be A/D-converted and transferred within 3 ns, which is unrealistic. For this reason, the signals of pixels arranged in a matrix are captured in ADCs through vertical readout lines arranged in respective columns, and the signals of pixels of a selected row are sequentially A/D-converted. Related techniques are disclosed in Japanese Unexamined Patent Publication No. 2008-098722 and Japanese Unexamined Patent Publication No. 2006-352597 as follows.

Japanese Unexamined Patent Publication No. 2008-098722 discloses a technique for enabling high-speed, high-resolution AD conversion in a CMOS image sensor in which column-parallel ADCs are mounted. In the CMOS image sensor in which column-parallel ADCs are mounted, with reference voltages Vref1 to Vref4 and a reference voltage Vref5 having different slopes, a column processing circuit includes a comparison circuit for comparing an output voltage Vx of a unit pixel with the reference voltages Vref1 to Vref4 and a comparison circuit for comparing the reference voltages Vref1 to Vref4 with the reference voltage Vref5. The operations of the two comparison circuits and an up/down counter enable high-resolution AD conversion to be performed at high speed.

Japanese Unexamined Patent Publication No. 2006-352597 discloses a technique developed by focusing on the point that an AD conversion time is dependent on a count period, particularly the second count period, which occupies most of the AD conversion time, thus making it difficult to reduce the AD conversion time. In a CMOS image sensor in which column-parallel ADCs are mounted, before the second AD conversion a signal voltage Vx of a column signal line is level-determined using a plurality of determination voltages in the AD conversion range, and based on the determination result, from among a plurality of reference voltages RAMP1 to RAMPn a reference voltage RAMP suitable for the signal voltage Vx of the column signal line is selected for AD conversion, thereby reducing the second AD conversion time.

SUMMARY OF THE INVENTION

In the configuration in which ADCs capture the signals of pixels of a selected row through vertical readout lines and sequentially A/D-convert the signals as described above, column circuits including the ADCs need to be arranged in the vertical direction of an image array. For example, if the column circuits are arranged at the top and bottom of the image array, the width of a column circuit can be twice the pixel pitch. However, if the pixel size is 5 μm, the circuit including an ADC has to be placed in a width of 10 μm which is twice the pixel size.

Accordingly, a very elongated column circuit having a width of 10 μm and a height of 1 mm or more has to be arranged in each column. Thus, there is a problem of a large constraint on ADC design.

Further, under such a constraint, there is required higher-speed AD conversion performed by ADCs provided in a solid-state image pickup device.

The present invention has been made to solve the above problems, and an object of one aspect of the invention is to provide a solid-state image pickup device including ADCs that can be arranged in a limited space.

Another object is to provide a solid-state image pickup device including ADCs that can perform AD conversion at high speed.

According to an aspect of the invention, a solid-state image pickup device is provided. The potential of a pixel signal outputted through a vertical readout line is held at a node. A plurality of capacitors are capacitively coupled to the node at which the pixel signal is held. The potential of the node is decreased in a stepwise manner by sequentially switching the voltages of the counter electrodes of the capacitors by the control of transistors. A comparator compares the potential of the node with the potential of the dark state of the pixel, and determines the upper bits of a digital value when the potential of the node becomes lower than the potential of the dark state. Following this, the conversion of the lower bits of the digital value is started.

According to this aspect, it is possible to simplify the configuration of each ADC and arrange each ADC in a limited space.

DETAILED DESCRIPTION OF THE PREFERRED EMBODIMENTS

Before describing the details of a solid-state image pickup device according to embodiments of the present invention, background techniques thereof will be described.

Figure 1:
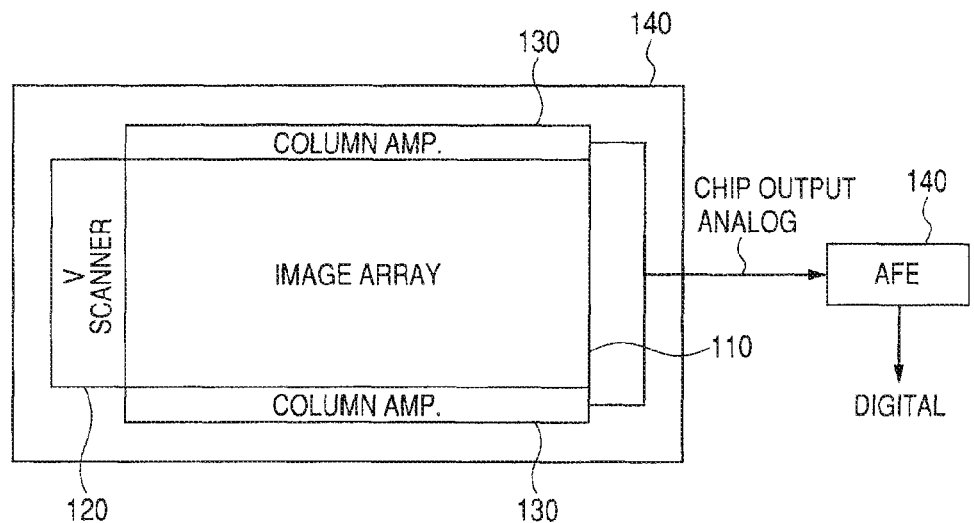
FIG. 1 is a diagram showing a configuration example of an analog image sensor.

FIG. 1 is a diagram showing a configuration example of an analog image sensor. The image sensor 100 includes an image array 110, a V-scanner 120 for scanning pixels in the vertical (column) direction, and column amplifiers 130 arranged in respective columns.

The column amplifiers 130 amplify pixel signals scanned and sent sequentially by the V-scanner 120, and output the analog signals to an AFE (Analog Front End) 140 arranged outside the chip. The AFE 140 converts the analog signals outputted from the image sensor 100 into digital signals, and outputs the digital signals.

The analog image sensor 100 has an advantage that the outputs of all pixels have uniform characteristics due to processing by the off-chip AFE 140. On the other hand, the analog image sensor has a disadvantage of being unsuitable to process moving images or the like with high frame rates and requiring AFE, design separately.

Figure 2:
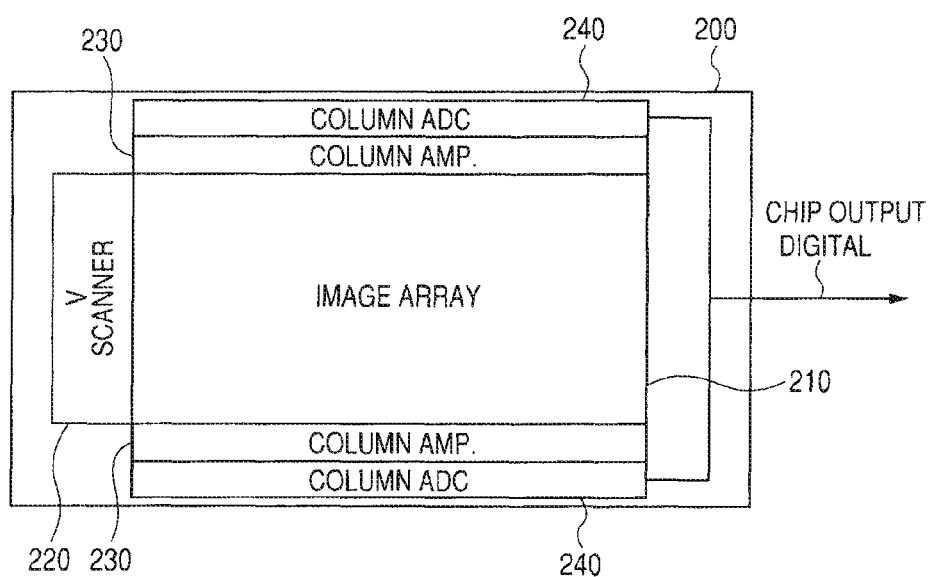
FIG. 2 is a diagram showing a configuration example of a digital image sensor.

FIG. 2 is a diagram showing a configuration example of a digital image sensor. The image sensor 200 includes an image array 210, a V-scanner 220 for scanning pixels in the vertical direction, column amplifiers 230 arranged in respective columns, and column ADCs 240 for converting analog signals outputted from the column amplifiers 230 into digital signals.

The column amplifiers 230 amplify pixel signals scanned and sent sequentially by the V-scanner 220, and output the analog signals to the column ADCs 240. The column ADCs 240 convert the analog signals outputted from the column amplifiers 230 into digital signals, and output the digital signals to the outside of the chip.

The digital image sensor has an advantage of enabling higher speed due to digital transfer and the utilization of an existing data output I/F (Interface) such as LVDS (Low Voltage Differential Signaling). Further, the digital image sensor has another advantage of enabling low-noise and high-precision design because each column ADC 240 is directly coupled to the corresponding column amplifier 230, and can provide 14-bit precision (60 μV) whereas the analog image sensor provides 12-bit precision (250 μV). On the other hand, the digital image sensor has a disadvantage that characteristics vary among the column ADCs, though linear FPN (Fixed Pattern Noise) enables digital correction.

Figure 3:
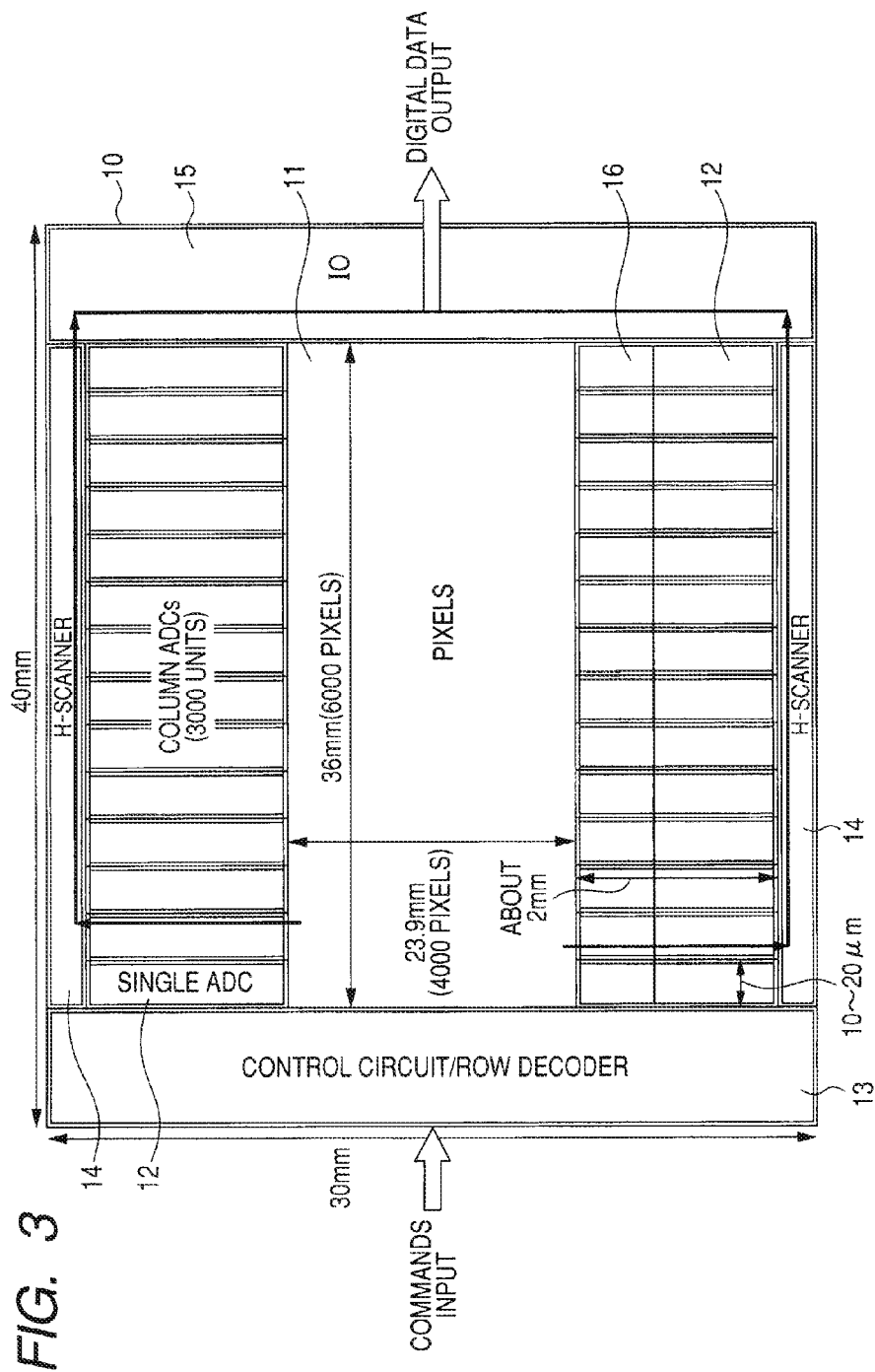
FIG. 3 is a diagram showing a disposition example of each unit of a solid-state image pickup device.

FIG. 3 is a diagram showing a disposition example of each unit of a solid-state image pickup device. The solid-state image pickup device 10 includes an image array 11, column ADCs 12 and PGAs (Programmable Gain Amplifiers) 16 arranged in respective pixel columns, a control circuit/row decoder 13 for overall controlling the solid-state image pickup device 10 and performing selection processing of the row direction of the image array 11, an H-scanner 14 for transferring digital signals outputted from the column ADCs 12 in the horizontal direction, and an IO (Input Output) unit 15 for outputting the digital signals transferred by the H-scanner 14 to the outside of the chip.

The width of the solid-state image pickup device 10 is about 40 mm, and sensors for 6000 pixels in the horizontal direction are arranged across a width of 36 mm thereof. The height of the solid-state image pickup device 10 is about 30 mm, and sensors for 4000 pixels in the vertical direction are arranged across a height of 23.9 mm thereof.

The column ADCs 12 are arranged at the top and bottom of the image array 11, where one column ADC 12 is arranged across the width of two columns of pixels. Therefore, 3000 column ADCs 12 are arranged at the top of the image array 11, and 3000 column ADCs 12 are arranged at the bottom of the image array 11.

The width of a column ADC 12 and a PGA 16 is about 10 to 20 μm which is twice the pixel pitch, and the sum of the heights of the column ADC 12 and the PGA 16 is about 2 mm, thus bringing about a very elongated shape. Since the column ADC 12 has to be designed under this constraint, it is essential to have a small and simple circuit configuration and enable power saving.

Figure 4:
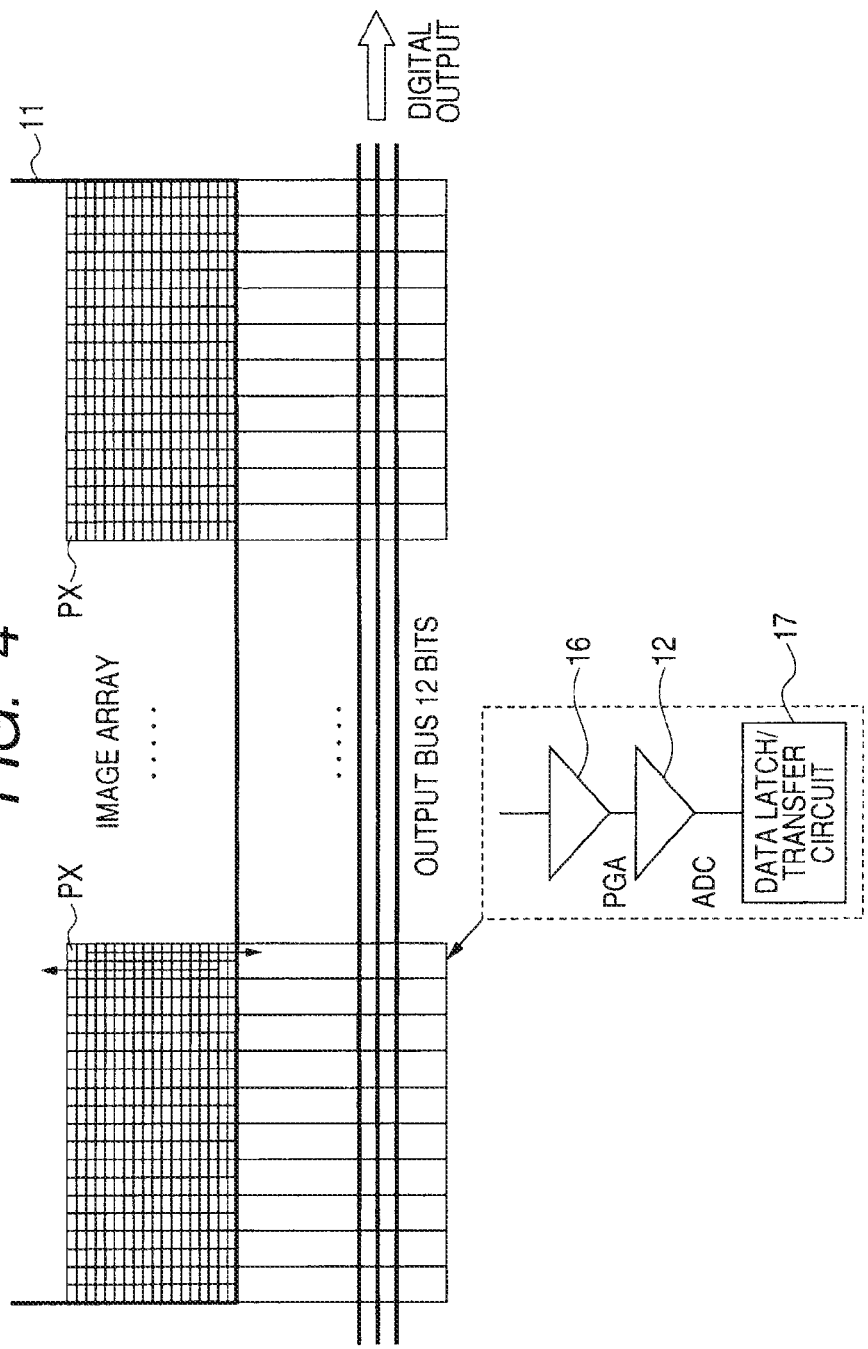
FIG. 4 is a partial enlarged diagram of an image array 11 and column circuits of a solid-state image pickup device 10 shown in FIG. 3.

FIG. 4 is a partial enlarged diagram of the image array 11 and column circuits of the solid-state image pickup device 10 shown in FIG. 3. One column circuit is provided in two columns of pixels PX of the image array 11. Each column circuit includes an ADC 12, a PGA (Programmable Gain Amplifier) 16, and a data latch/transfer circuit 17.

The PGA 16 amplifies pixel outputs sequentially sent from pixels PX of the column direction, and outputs the analog signals to the ADC 12. The ADC 12 converts the analog signals received from the PGA 16 into digital signals, and outputs the digital signals to the data latch/transfer circuit 17. The data latch/transfer circuit 17 sequentially shifts the digital values of pixel outputs of the row direction, and outputs digital signals for 3000 pixels to the outside. Further, the same circuits are arranged at the top of the image array 11.

Figure 5:
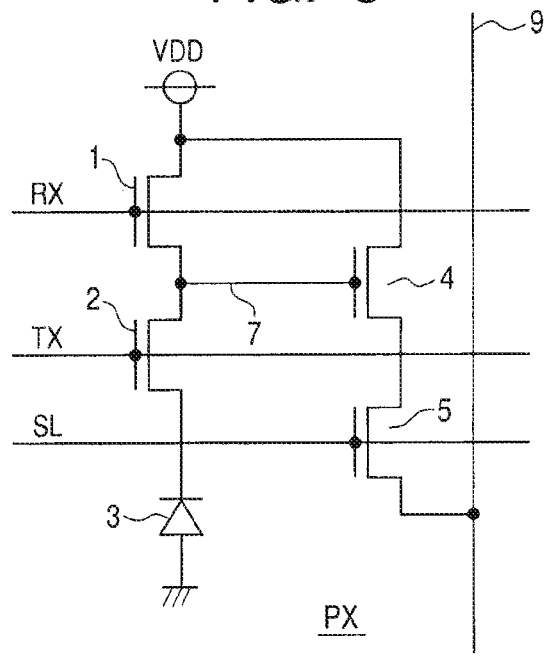
FIG. 5 is a diagram showing an electrical equivalent circuit of a pixel PX shown in FIG. 4.

FIG. 5 is a diagram showing an electrical equivalent circuit of a pixel PX shown in FIG. 4. The pixel PX includes a photodiode 3 for converting an optical signal into an electrical signal, a transfer transistor 2 for transferring the electrical signal generated by the photodiode 3 in accordance with a transfer control signal TX on a transfer control line, and a reset transistor 1 for resetting a floating diffusion 7 to a predetermined voltage level in accordance with a reset control signal RX on a reset control line.

The pixel PX further includes a source follower transistor 4 for transferring a power supply voltage VDD on a power node in source follower mode in accordance with a signal potential on the floating diffusion 7, and a row selection transistor 5 for transferring a signal transferred by the source follower transistor 4 to a vertical readout line 9 in accordance with a row selection signal SL on a row selection control line. The transistors 1, 2, 4, and 5 are formed of e.g. N-channel MOS transistors. Therefore, the pixel PX is a pixel of a CMOS image sensor.

Figure 6:
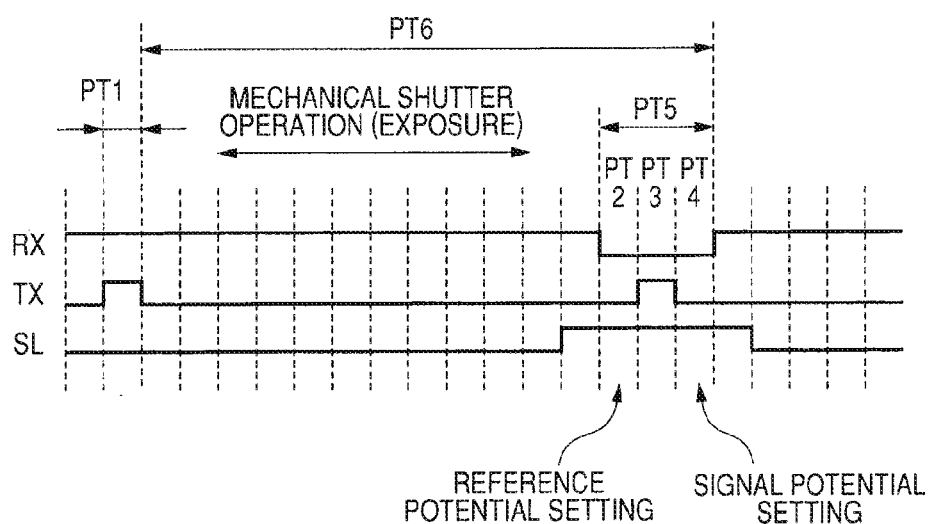
FIG. 6 is a timing chart of assistance in explaining the signal readout operation of the pixel PX shown in HG. 5.

FIG. 6 is a timing chart of assistance in explaining the signal readout operation of the pixel PX shown in FIG. 5. Hereinafter, the signal readout operation of the pixel PX shown in FIG. 5 will be described with reference to FIG. 6.

In a period PT1, with the reset control signal RX being at a high level (hereinafter abbreviated as H level), the transfer control signal TX is set to the H level. The reset transistor 1 and the transfer transistor 2 enter an ON state, and an electrical signal converted by the photodiode 3 is initialized. That is, charge stored by photoelectric conversion performed by the photodiode 3 in the preceding cycle is released.

When the transfer control signal TX becomes a low level (hereinafter abbreviated as L level) and the transfer transistor 2 enters an OFF state, photoelectric conversion is performed again by the photodiode 3 so that signal charge is stored. In this state, the reset control signal RX remains at the H level, and the reset transistor 1 remains in the ON state. If the reset control signal RX is at the power supply voltage VDD, the floating diffusion 7 is maintained at a voltage level that is lower than the power supply voltage VDD by the threshold voltage of the reset transistor 1.

Next, the row selection signal SL becomes the H level, and the row selection transistor 5 is activated. By a source follower operation performed by the source follower transistor 4, the signal of a potential according to a potential on the floating diffusion 7 is transferred to the vertical readout line 9. After this, a pixel readout period PT5 is started.

In the pixel readout period PT5, first in a period PT2, the reset control signal RX becomes the L level, and the reset transistor 1 enters the OFF state. A signal according to a signal potential on the floating diffusion 7 is transferred to the vertical readout line 9 so that a reference capacitive element included in a readout circuit (not shown) is charged. In the period PT2, the reference potential of the signal of the pixel PX is set. This corresponds to the sampling of information on the dark state of the pixel as will be described later.

Next, in a period PT3, the transfer control signal TX becomes the H level, and the transfer transistor 2 is activated, so that the charge stored by photoelectric conversion performed by the photodiode 3 is transferred to the floating diffusion 7. Accordingly, the potential on the vertical readout line 9 changes to a potential according to the charge from the pixel. When the transfer control signal TX becomes the L level, a signal charge storing capacitive element included in the readout circuit (not shown) is charged in accordance with the potential on the vertical readout line 9 in a period PT4. This corresponds to the sampling of information on the light state of the pixel as will be described later.

Next, the reference potential and the signal potential which are read out in the periods PT2 and PT4 respectively are differentially amplified for the readout of the signal of the pixel PX (pixel signal).

Sampling is performed twice for one pixel and the initial potential and the signal potential are compared, thus performing the so-called correlated double sampling to offset the influence of noise in the pixel PX for the readout of the electrical signal generated by the photodiode 3.

After the completion of the signal readout from the pixel PX, the row selection signal SL becomes the L level, and the row selection transistor 5 enters the OFF state.

The pixels PX are arranged in a matrix, and the signals of pixels of a row are read out in parallel. In the pixel PX, in a period PT6 from the end of the reset period PT1 to the end of the readout period PT5, the photodiode 3 converts an optical signal into an electrical signal to generate signal charge.

As shown in FIG. 5, the pixel PX is comprised of the photodiode 3 and the N-channel MOS transistors, and the pixel signal is read out to the vertical readout line 9 through the row selection transistor 5. Therefore, unlike the CCD image sensor, the selection sequence of the row selection transistor 5 and the vertical readout line 9 can be set randomly.

Figure 7:
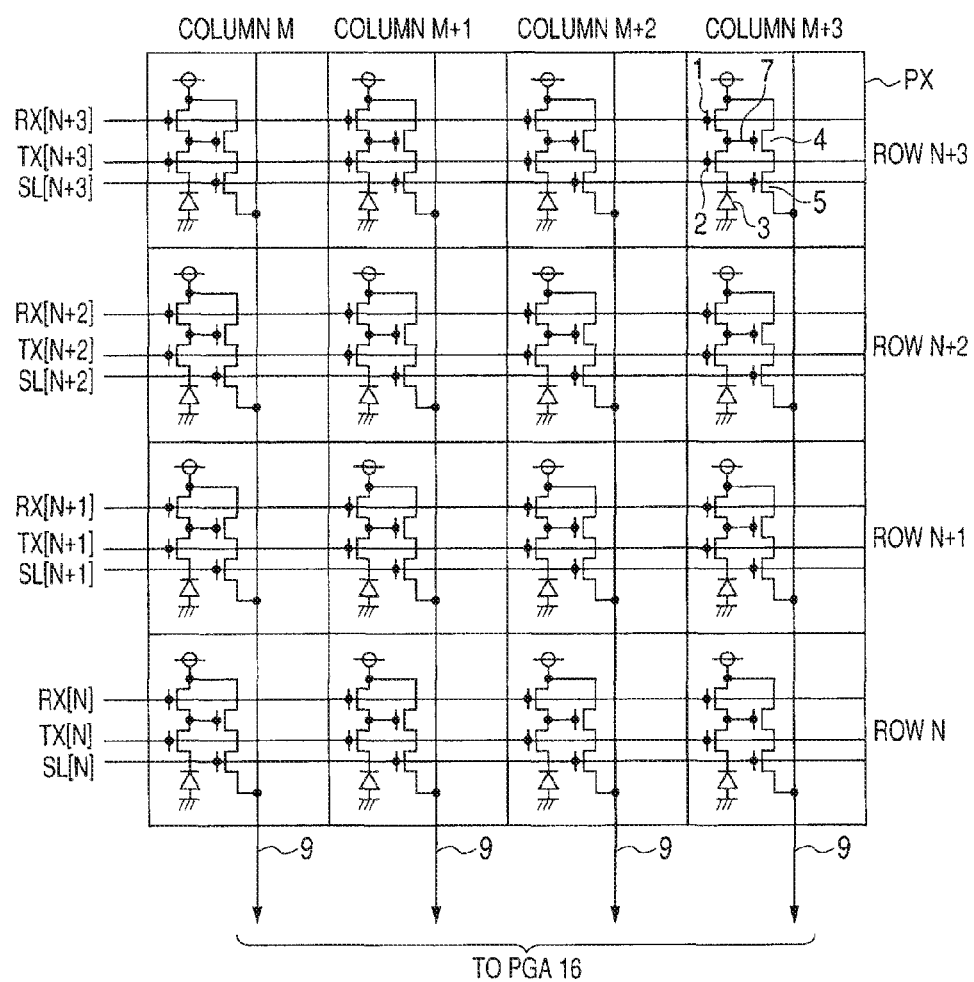
FIG. 7 is a diagram showing the configuration of the main part of the image array 11.

FIG. 7 is a diagram showing the configuration of the main part of the image array 11. FIG. 7 shows representative pixels PX arranged in four rows and four columns with the Nth to (N+3)th rows and the Mth to (M+3)th columns. These pixels PX have the same configuration as the pixel PX shown in FIG. 5.

The pixels PX are arranged in a matrix, and a set of a reset control signal RX[i], a transfer control signal TX[i], and a row selection control signal SL[i] (i is any one of N to N+3) are supplied to each row. The vertical readout line 9 is arranged in each pixel column.

Figure 8:
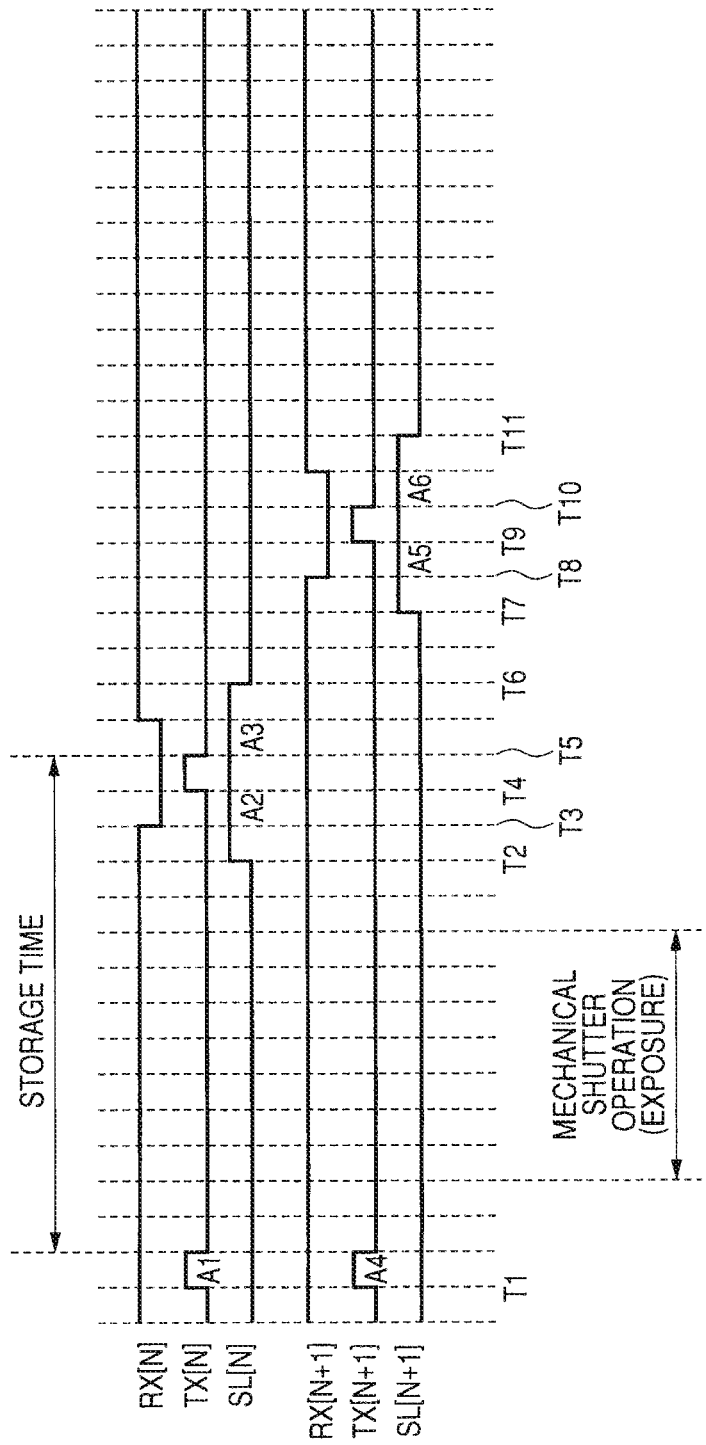
FIG. 8 is a timing chart showing the data readout operation of the image array 11 shown in FIG. 7.

FIG. 8 is a timing chart showing the data readout operation of the image array 11 shown in FIG. 7. Hereinafter, the pixel signal readout operation of the image array 11 shown in FIG. 7 will be described with reference to FIG. 8.

At a time T1, the transfer control signals TX[N] and TX[N+1] corresponding to the Nth and (N+1)th rows respectively are driven to the H level. The reset control signals RX[N] and RX[N+1] are at the H level, and the reset transistor 1 is in the ON state. In periods A1 and A4 starting from the time T1, charge stored by the photodiode 3 is released in the Nth and (N+1)th rows. Accordingly, in the Nth and (N+1)th rows, the floating diffusion 7 shown in FIG. 5 is reset to a predetermined initial voltage level.

At a time T2 after an elapse of a predetermined time, the row selection signal SL[N] corresponding to the Nth row rises to the H level. Thereby, the row selection transistor 5 of each pixel PX in the Nth row enters the ON state, so that the source follower transistor 4 is coupled to the corresponding vertical readout line 9.

Next, the reset control signal RX[N] falls to the L level, and the reset transistor 1 of each pixel in the Nth row enters the OFF state, so that the floating diffusion 7 is maintained at a reset potential level.

At a time T4, the transfer control signal TX[N] becomes the H level, and the transfer transistor 2 of each pixel in the Nth row enters the ON state, so that signal charge generated by the photodiode 3 is transferred to the floating diffusion 7. At this time, the row selection signal SL[N] is at the H level, so that the pixel signal is read out to the vertical readout line 9 in accordance with the potential of the floating diffusion 7.

After the completion of the pixel readout operation in the Nth row, the reset control signal RX[N] becomes the H level, so that the floating diffusion 7 is again charged to the initial voltage level through the reset transistor 1.

At a time T6, the row selection signal SL[N] becomes the L level, and the row selection transistor 5 enters the OFF state, so that the readout of the signal charge of each pixel in the Nth row has been completed.

Next, pixel signals in the (N+1)th row are read out. That is, at a time T7, the row selection signal SL[N+1] rises to the H level, so that the source follower transistor of each pixel PX in the (N+1)th row is coupled to the corresponding vertical readout line 9.

Next, at a time T8, the reset control signal RX[N+1] becomes the L level, and an additional operation on the floating diffusion 7 has been completed.

At a time T9, the transfer control signal TX[N+1] becomes the H level, and the potential of the floating diffusion 7 changes in accordance with signal charge generated by the photodiode 3, so that the pixel signal is read out to the vertical readout line 9 in accordance with this potential.

At a time T11, the row selection signal SL[N+1] falls to the L level, and the readouts from pixels in the Nth and (N+1)th rows have been completed. By repeating the above operations, pixel information of the column direction is sequentially outputted to the PGA 16.

First Embodiment

Figure 9:
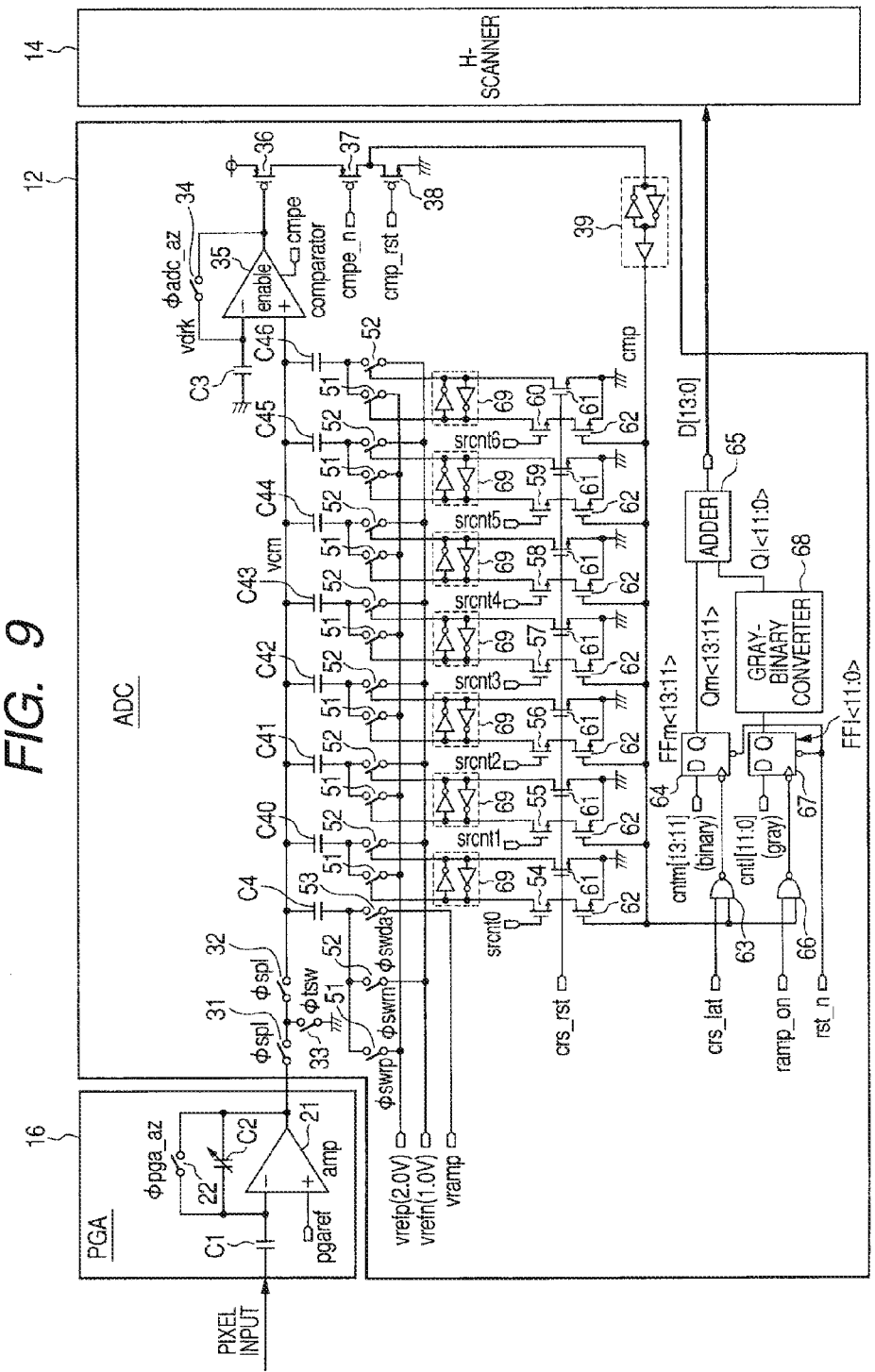
FIG. 9 is a diagram showing a configuration example of an ADC and a PGA according to a first embodiment of the invention.

FIG. 9 is a diagram showing a configuration example of an ADC and a PGA according to the first embodiment of the invention. The PGA 16 includes a differential amplifier (amp) 21, a switch 22, a capacitor C1, and a variable capacitor C2. A reference voltage pgaref is coupled to the positive input of the differential amplifier 21, and a pixel input signal is coupled to the negative input thereof through the capacitor C1.

The output of the differential amplifier 21 is coupled to the switch 22 and the variable capacitor C2 for negative feedback, and coupled to a switch 31 in the ADC 12. Further, the gain of the PGA 16 can be varied by the variable capacitor C2.

The ADC 12 includes switches 31 to 34 and 51 to 53, a comparator 35, P-channel MOS transistors 36 and 37, N-channel MOS transistors 38 and 54 to 62, holding circuits 39 and 69, NAND circuits 63 and 66, flip-flops (FFs) 64 and 67, an adder 65, a Gray-binary converter 68, and capacitors C3 to C4 and C40 to C46.

The amplified pixel input outputted from the PGA 16 is coupled to the positive input of the comparator 35 through the switches 31 and 32. The negative input of the comparator 35 is coupled to the output of the comparator 35 through the switch 34, and coupled to the capacitor C3 for holding information on the dark state of the pixel.

The FF 64 holds an output value of a 3-bit counter (not shown). When a positive input and a negative input of the comparator 35 match each other and a coarse latch signal crs_lat changes to the H level, the FF 64 holds an output value cntm<13:11> of the counter, and outputs it to the adder 65. The output value of the 3-bit counter corresponds to the upper 3 bits of an AD-converted digital value, and is a binary code. The 3-bit counter (not shown) is provided in the control circuit/row decoder 13 shown in FIG. 3.

The FF 67 holds an output value of a 12-bit counter (not shown). When a positive input and a negative input of the comparator 35 match each other and a signal ramp_on is at the H level, the FF 67 holds an output value cntl<11:0> of the counter, and outputs it. The output value of the 12-bit counter, including 1-bit over-range, corresponds to the lower 11 bits of an AD-converted digital value, and is a Gray code. The 12-bit counter (not shown) is provided in the control circuit/row decoder 13 shown in FIG. 3.

The Gray-binary converter 68 converts a 12-bit Gray code outputted from the FF 67 into a binary code Ql<11:0>, and outputs it to the adder 65.

The adder 65 adds 3-bit Qm<13:11> outputted from the FF 64 and 12-bit Ql<11:0> outputted from the FF 67, and outputs the resulting data to the H-scanner 14.

The capacitors C4 and C40 to C46 have the same capacitance, and are capacitively coupled to vcm. By sequentially switching the switches 51 to 53 coupled to these capacitors, the counter electrodes of the capacitors C4 and C40 to C46 are sequentially switched from Vrt to Vrb, thus to determine which of eight ranges the potential of vcm belongs to. The transistors 54 to 62 control the switching between the switches 51 and 52, and the operation will be detailed later.

Signals such as φspl, φtsw, φadc_az, cmpe, cmpe_n, cmp_rst, φswrp, φswrn, φswda, srcnt0 to srcnt6, vrefp, vrefn, vramp, crs_rst, crs_lat, ramp_on, and rst_n shown in FIG. 9 are generated by the control circuit/row decoder 13 shown in FIG. 3, and supplied in common to the 3000 column ADCs 12 arranged at the top and the 3000 column ADCs 12 arranged at the bottom.

Figure 10:
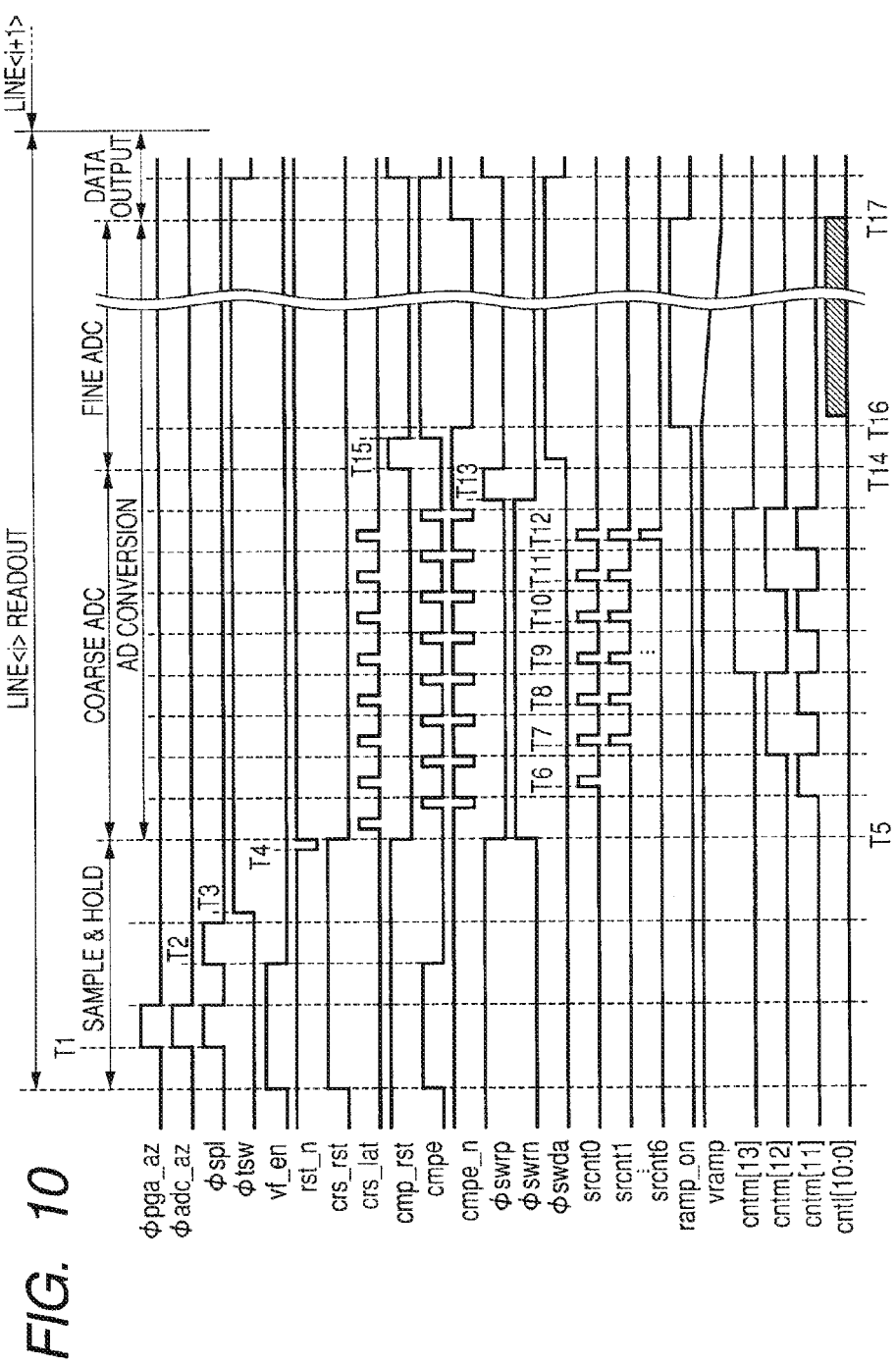
FIG. 10 is a timing chart of assistance in explaining the pixel signal readout operation by the ADC 12 and the PGA 16 shown in FIG. 9.

FIG. 10 is a timing chart of assistance in explaining the pixel signal readout operation by the ADC 12 and the PGA 16 shown in FIG. 9. This readout operation is comprised of three stages which are "Sample & Hold", "AD Conversion", and "Data Output", and indicates the readout operation of pixel information in the ith row. Further, the AD conversion stage is divided into two stages which are a coarse AD conversion stage and a fine AD conversion stage.

First, at a time T1, the sample & hold stage is started. A PGA auto-zero signal φpga_az, an ADC auto-zero signal φadc_az, and a sampling signal φspl become the H level, and the switches 31, 32, and 34 enter the ON state. At this time, information on the dark state of the pixel is sampled and held at the node vcm. The comparator 35 holds the potential of information on the dark state of the pixel at the positive electrode (vdrk) of the capacitor C3.

Then, at a time T2, the signal spl becomes the H level again, and the potential of information on the light state of the pixel outputted from the PGA 16 is sampled and held at the node vcm. At this time, a signal vf_en and a signal cmpe become the L level. The signal vf_en selects whether to operate the comparator 35 as an operational amplifier or comparator, that is, operates the comparator 35 as an operational amplifier when the signal vf_en is at the H level and as a comparator when the signal vf_en is at the L level. The signal cmpe enables the output of the comparator 35 when the signal cmpe is at the H level.

At a time T3, a signal φtsw changes from the L level to the H level, and the switch 33 enters the ON state, thereby initializing the output of the PGA 16. Then, at a time T4, a signal rst_n becomes the L level, and the FFs 64 and 67 is cleared.

Then, at a time T5, the coarse AD conversion stage is started. A signal φswrp changes from the H level to the L level and a signal φswrn changes from the L level to the H level, so that the switch 51 coupled to the capacitor C4 changes from the ON state to the OFF state and the switch 52 changes from the OFF state to the ON state. As a result, the counter electrode of the capacitor C4 capacitively coupled to vcm changes from vrefp (2.0V) to vrefn (1.0V). At this time, the potential of vcm decreases by (Vrt−Vrb)/8.

Further, a signal crs_rst changes from the H level to the L level; however, the holding circuits 69 hold the L level at the right terminals and the H level at the left terminals, so that the switches 51 coupled to the capacitors C40 to C46 remain in the ON state and the switches 52 remain in the OFF state.

After the time T5, the respective eight pulses of a signal crs_lat, the signal cmpe, and a signal cmpe_n are outputted in synchronization with the change of the output cntm[13:11] of the upper 3-bit counter.

At a time T6, a signal srcnt0 changes from the L level to the H level, and the transistor 54 enters the ON state. At this time, the transistor 62 is in the ON state, so that the switch 51 coupled to the capacitor C40 enters the OFF state, and the switch 52 enters the ON state. As a result, the counter electrode of the capacitor C40 capacitively coupled to vcm changes from vrefp (2.0V) to vrefn (1.0V), and the potential of vcm further decreases by (Vrt−Vrb)/8.

Further, at a time T7, a signal srcnt1 changes from the L level to the H level, and the transistor 55 enters the ON state. At this time, the transistor 62 is in the ON state, so that the switch 51 coupled to the capacitor C41 enters the OFF state, and the switch 52 enters the ON state. As a result, the counter electrode of the capacitor C41 capacitively coupled to vcm changes from vrefp (2.0V) to vrefn (1.0V), and the potential of vcm further decreases by (Vrt−Vrb)/8.

At times T8 to T12, similar operations are performed, thus decreasing the potential of vcm in steps of (Vrt−Vrb)/8. When the potential of vcm becomes lower than the potential of vdrk, the comparator 35 outputs the L level. At this time, the transistor 36 enters the ON state, and the holding circuit 39 changes a signal cmp from the H level to the L level. The FF 64 holds the value of the output cntm<13:11> of the 3-bit counter at the rising edge of a signal outputted from the NAND circuit 63.

At a time T13, the signal φswrp changes from the L level to the H level and the signal φswrn changes from the H level to the L level, so that the switch 51 coupled to the capacitor C4 changes from the OFF state to the ON state and the switch 52 changes from the ON state to the OFF state. As a result, the counter electrode of the capacitor C4 capacitively coupled to vcm changes from vrefn (1.0V) to vrefp (2.0V).

At a time T14, the fine AD conversion stage is started. A signal cmp_rst becomes the H level, and the holding circuit 39 changes the signal cmp to the H level. At a time T15, the signal cmp_rst becomes the L level, and the signal cmpe becomes the H level. At a time T16, the signal cmpe_n becomes the L level, and a signal ramp_on becomes the H level.

Figure 11:
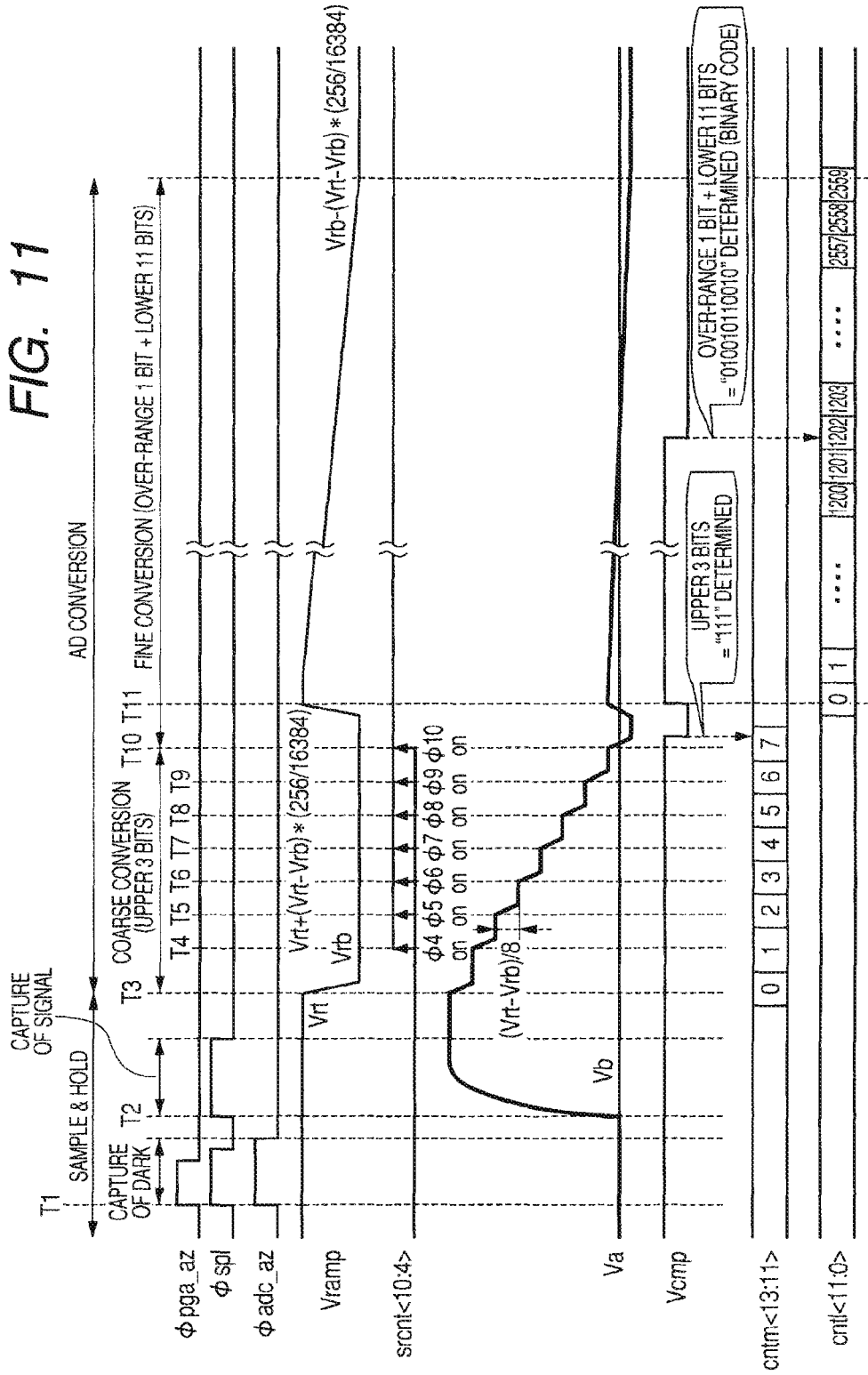
FIG. 11 is a timing chart of assistance in explaining in further detail the operation shown in the timing chart of FIG. 10.

FIG. 11 is a timing chart of assistance in explaining in further detail the operation shown in the timing chart of FIG. 10. First, at a time T1, the PGA auto-zero signal φpga_az, the ADC auto-zero signal φadc_az, and the sampling signal φspl become the H level, and the comparator 35 holds the potential of information on the dark state of the pixel at the positive electrode (vdrk) of the capacitor C3.

Then, at a time T2, the signal spl becomes the H level again, and the potential of information on the light state of the pixel outputted from the PGA 16 is sampled and held at the node vcm. In FIG. 11, Va denotes the potential of the dark state of the pixel, and Vb denotes the potential of the light state of the pixel.

At a time T3, the counter electrode of the capacitor C4 capacitively coupled to vcm changes from vrefp (2.0V) to vrefn (1.0V). At this time, the potential of vcm decreases by (Vrt−Vrb)/8. The output value cntm<13:11> of the 3-bit counter is "0".

At a time T4, the counter electrode of the capacitor C40 capacitively coupled to vcm changes from vrefp (2.0V) to vrefn (1.0V). At this time, the potential of vcm further decreases by (Vrt−Vrb)/8. The output value cntm<13:11> of the 3-bit counter is "1".

At times T5 to T9, similar operations are performed. When the potential of vcm further decreases by (Vrt−Vrb)/8 at a time T10, the potential Vb of vcm becomes lower than the potential Va of vdrk, and the holding circuit 39 outputs the L level of a signal cmp (Vcmp). At this time, the value "111" of the output cntm[13:11] of the 3-bit counter is determined as the upper 3 bits of an AD-converted digital value. That is, the digital value of this pixel information ranges as follows: 14336 (=2048×7)≤pixel information≤16383 (=2048×8−1).

After the time T10, the fine AD conversion stage is performed to determine the value of the pixel information in the above range. At a time T11, a signal φswda becomes the H level so that the switch 53 enters the ON state, and vramp which is the potential of the counter electrode of the capacitor C4 increases to Vrt+(Vrt−Vrb)×(256/2048). At this time, the 12-bit counter provided in the control circuit/row decoder 13 starts count-up from "0" in decimal notation.

After that, the potential of Vramp decreases to Vrb−(Vrt−Vrb)×(256/2048) in a slope manner. At the end of the decrease in the potential of the counter electrode of the capacitor C4, the value of the 12-bit counter becomes "2559" in decimal notation.

Thereby, the potential of vcm increases by (Vrt−Vrb)×{1+(256/2048)}×(⅛) compared to the value at the end of the coarse AD conversion stage. Then, the potential of vcm decreases, in a slope manner, by (Vrt−Vrb)×{1−(256/2048)}×(⅛) compared to the value at the end of the coarse AD conversion stage.

When the potential of node vcm becomes lower than the potential of vdrk, the comparator 35 outputs the L level. At this time, the transistor 36 enters the ON state, and the holding circuit 39 changes the signal cmp from the H level to the L level.

The FF 67 holds the value of the output cntl[11:0] of the 12-bit counter at the rising edge of a signal outputted from the NAND circuit 66. In FIG. 11, the FF 67 holds "1202" in decimal notation. The Gray-binary converter 68 converts a 12-bit Gray code outputted from the FF 67 into a binary code Ql<11:0>, and outputs it to the adder 65.

The upper 3 bits of the digital value are determined in the coarse AD conversion stage, and the lower 12 bits of the digital value including 1-bit over-range are determined in the fine AD conversion stage. In FIG. 11, the upper 3 bits and the lower 12 bits of the digital value are "14336" and "1202" in decimal notation, respectively. The adder 65 calculates D<13:0>=Qm<13:11>+Ql<11:0>−256, and outputs "15282" in decimal notation.

As described above, according to the solid-state image pickup device of this embodiment, AD conversion is performed by holding the potential of information on the dark state of the pixel at the positive electrode (vdrk) of the capacitor C3, which can simplify the circuit configuration of each ADC and mount each ADC in a limited space. Further, the above-described circuit configuration can reduce power consumption. Furthermore, according to the solid-state image pickup device of this embodiment, the upper bits of pixel information are determined in the coarse AD conversion stage, and the lower bits of pixel information are determined in the fine AD conversion stage, which enables higher-speed AD conversion.

Second Embodiment

Figure 12:
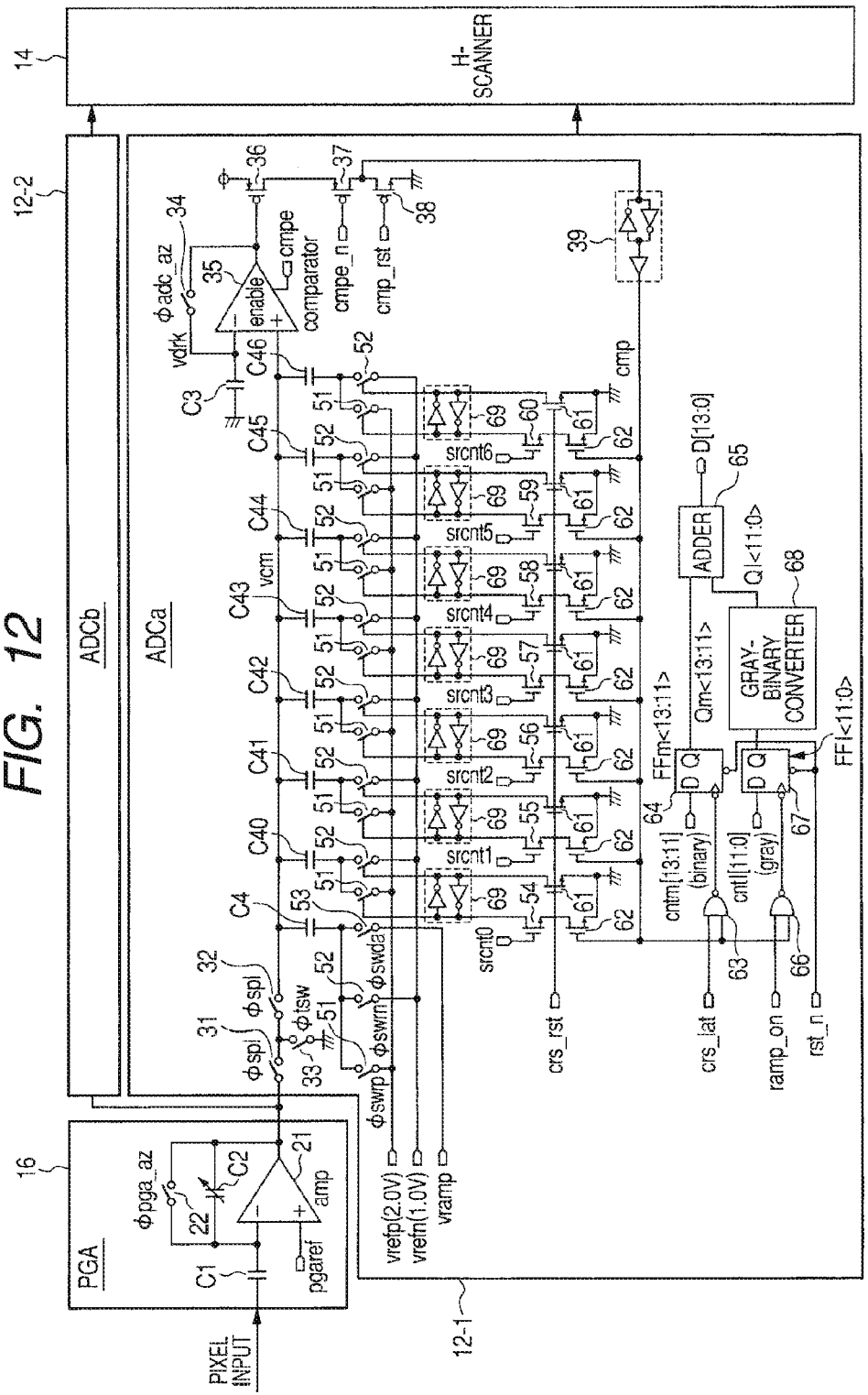
FIG. 12 is a diagram showing a configuration example of ADCs and a PGA according to a second embodiment of the invention.

FIG. 12 is a diagram showing a configuration example of ADCs and a PGA according to the second embodiment of the invention. The configuration of the ADCs and the PGA according to the second embodiment differs from that of the first embodiment shown in FIG. 9 in that two ADCs are provided to one PGA and AD conversion is performed by interleaving. Therefore, detailed description of overlapping configurations and functions will not be repeated.

The control circuit/row decoder 13 generates respective control signals for an ADCa 12-1 and an ADCb 12-2. That is, two sets of signals such as φspl, φtsw, φadc_az, cmpe, cmpe_n, cmp_rst, φswrp, φswrn, φswda, srcnt0 to srcnt6, vrefp, vrefn, vramp, crs_rst, crs_lat, ramp_on, and rst_n are generated, and the respective sets of control signals are supplied to the ADCa 12-1 and the ADCb 12-2 which operate at different timings, thereby implementing interleaving.

Figure 13:
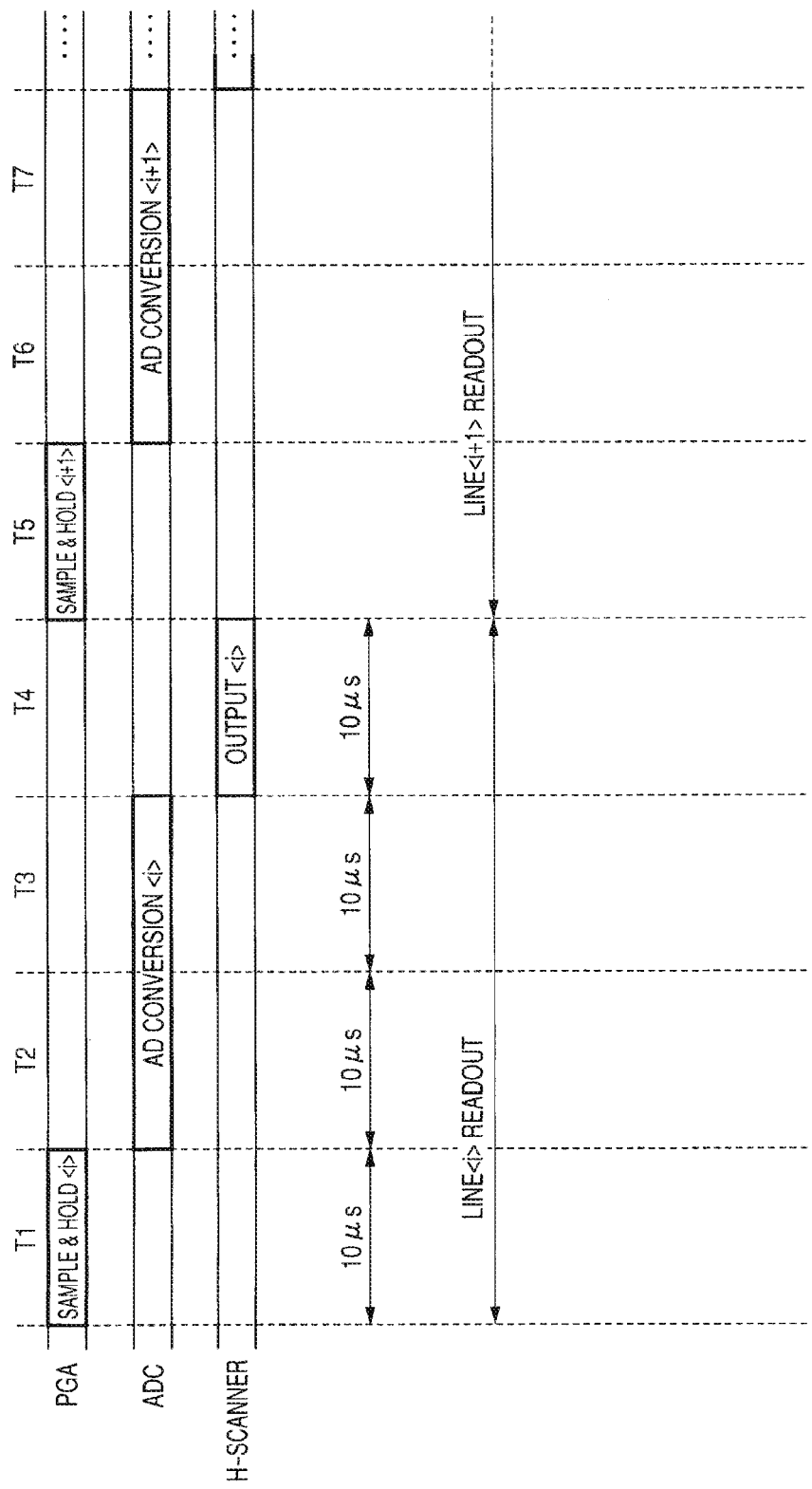
FIG. 13 is a diagram of assistance in explaining the timing of each stage in the readout operation (non-interleaving) of pixel information in the solid-state image pickup device according to the first embodiment.

FIG. 13 is a diagram of assistance in explaining the timing of each stage in the readout operation (non-interleaving) of pixel information in the solid-state image pickup device according to the first embodiment. In FIG. 13, the time required for the sample & hold stage is 10 μs, the time required for the AD conversion stage is 20 μs, and the time required for the data output stage is 10 μs.

In a period T1, the PGA 16 performs the sample & hold stage of pixel information in the ith row. In periods T2 to T3, the ADC 12 performs the AD conversion stage of pixel information in the ith row. Then, in a period T4, the H-scanner 14 performs the data output stage of digitally converted pixel information in the ith row.

After the readout operation of pixel information in the ith row is completed, the readout operation of pixel information in the (i+1)th row is performed in periods T5 to T8. As shown in FIG. 13, after the readout operation of pixel information in the ith row is completed, the readout operation of pixel information in the (i+1)th row is performed; therefore, the readout time per row is 40 μs, and the frame rate is 6.3 frames/s.

Figure 14:
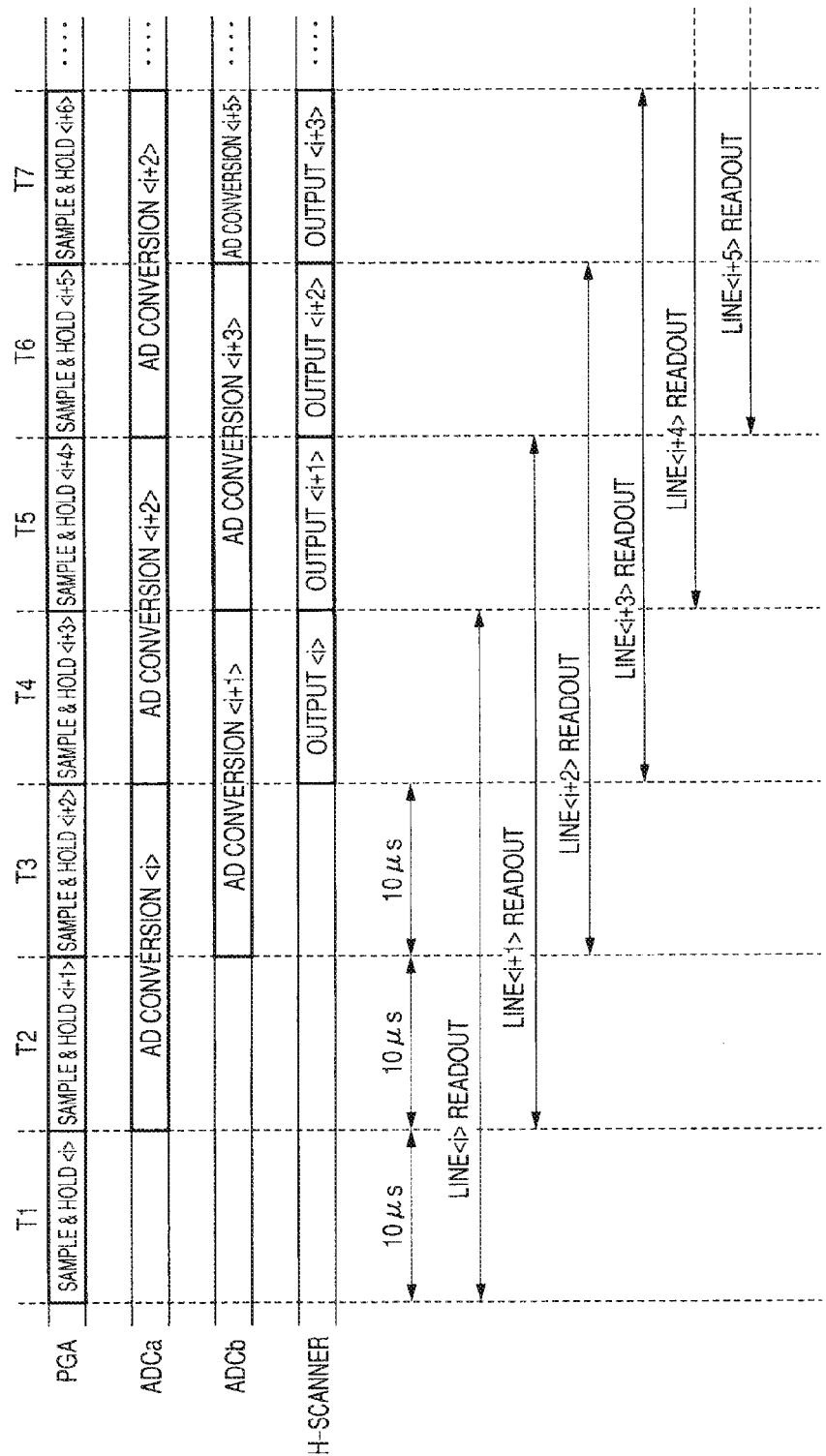
FIG. 14 is a diagram of assistance in explaining the timing of each stage in the readout operation (interleaving) of pixel information in a solid-state image pickup device according to the second embodiment.

FIG. 14 is a diagram of assistance in explaining the timing of each stage in the readout operation (interleaving) of pixel information in the solid-state image pickup device according to the second embodiment. In FIG. 14 as well, the time required for the sample & hold stage is 10 μs, the time required for the AD conversion stage is 20 μs, and the time required for the data output stage is 10 μs.

In a period T1, the PGA 16 performs the sample & hold stage of pixel information in the ith row. In periods T2 to T3, the ADCa 12-1 performs the AD conversion stage of pixel information in the ith row. Concurrently, in the period T2, the PGA 16 performs the sample & hold stage of pixel information in the (i+1)th row. Further, in the period T3, the PGA 16 performs the sample & hold stage of pixel information in the (i+2)th row, and the ADCb 12-2 starts the AD conversion stage of pixel information in the (i+1)th row.

In a period T4, the PGA 16 performs the sample & hold stage of pixel information in the (i+3)th row. At this time, the ADCa 12-1 starts the AD conversion stage of pixel information in the (i+2)th row. Further, the ADCb 12-2 continues the AD conversion stage of pixel information in the (i+1)th row. Furthermore, the H-scanner 14 performs the data output stage of pixel information in the ith row.

Thus, the PGA 16 outputs sampled pixel information alternately to the two ADCs. Accordingly, the readout time per row is apparently 10 μs, and the frame rate can be 25 frames/s (high frame rate).

As described above, according to the solid-state image pickup device of this embodiment, the PGA 16 outputs sampled pixel information alternately to the two ADCs, and the two ADCs perform AD conversion stages concurrently, which enables higher-speed readout operation and the high frame rate, in addition to the advantageous effects described in the first embodiment.

Third Embodiment

The configuration of a solid-state image pickup device according to the third embodiment of the invention is the same as the configuration of the solid-state image pickup device described in the first embodiment. Therefore, detailed description of overlapping configurations and functions will not be repeated.

As shown in FIG. 13, in the case where the stages are not performed concurrently, the readout time per row is as long as 40 μs. In the solid-state image pickup device according to the third embodiment of the invention, with a pipeline system, AD conversion is performed at high speed.

Figure 15:
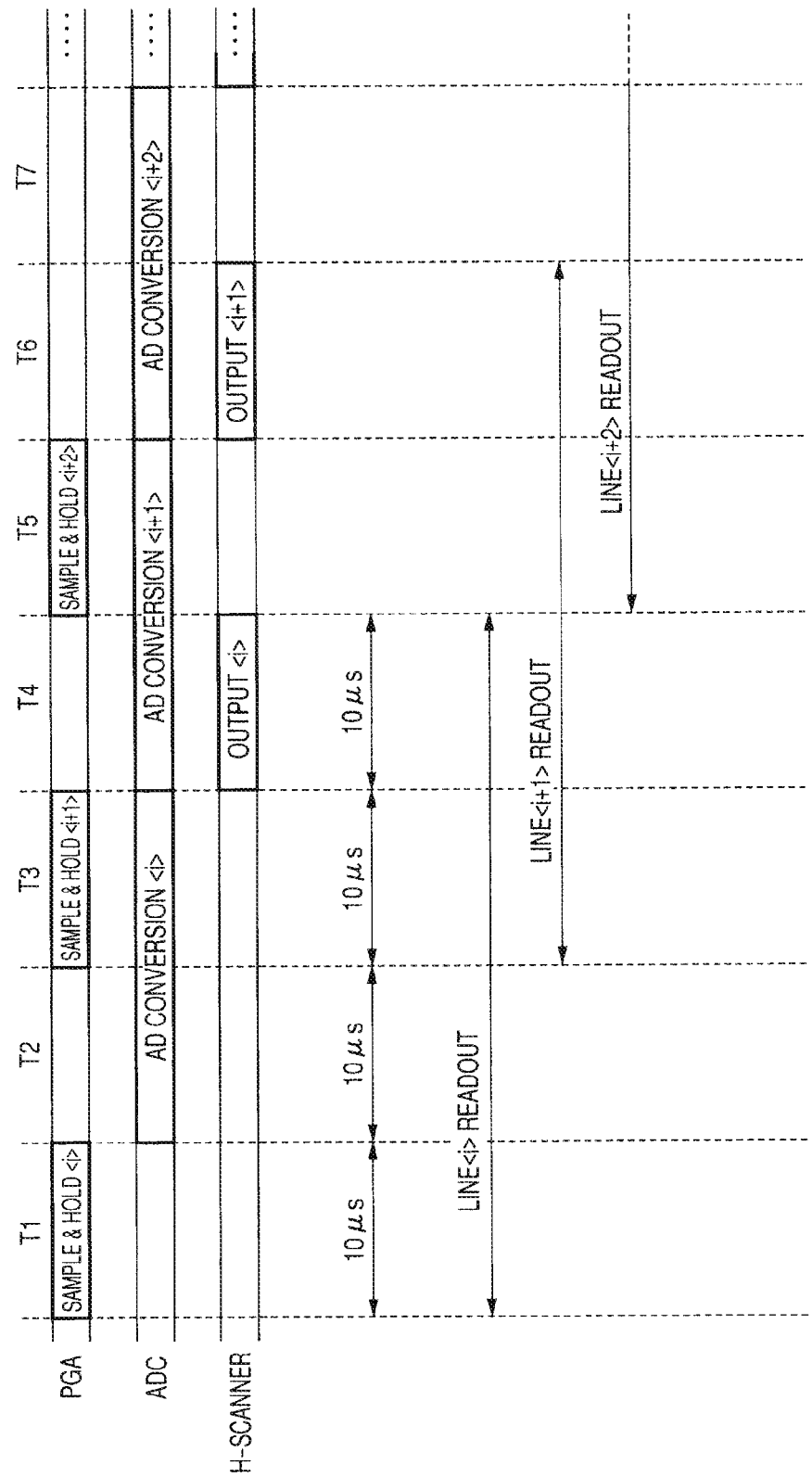
FIG. 15 is a diagram of assistance in explaining an example of the timing of each stage in the readout operation (pipeline system) of pixel information in a solid-state image pickup device according to a third embodiment of the invention.

FIG. 15 is a diagram of assistance in explaining an example of the timing of each stage in the readout operation (pipeline system) of pixel information in the solid-state image pickup device according to the third embodiment of the invention. In FIG. 15 as well, the time required for the sample & hold stage is 10 µs, the time required for the AD conversion stage is 20 µs, and the time required for the data output stage is 10 µs.

In a period T1, the PGA 16 performs the sample & hold stage of pixel information in the ith row. In periods T2 to T3, the ADC 12 performs the AD conversion stage of pixel information in the ith row. Concurrently, in the period T3, the PGA 16 performs the sample & hold stage of pixel information in the (i+1)th row.

In periods T4 to T5, the ADC 12 performs the AD conversion stage of pixel information in the (i+1)th row. Concurrently, in the period T4, the H-scanner 14 performs the data output stage of digitally converted pixel information in the ith row. Further, in the period T5, the PGA 16 performs the sample & hold stage of pixel information in the (i+2)th row.

Thus, while the ADC 12 performs the AD conversion stage of pixel information in one row, the PGA 16 performs the sample & hold stage of pixel information in the next row. Accordingly, the readout time per row is apparently 20 µs, and the frame rate can be 12.5 frames/s (middle frame rate).

Figure 16:
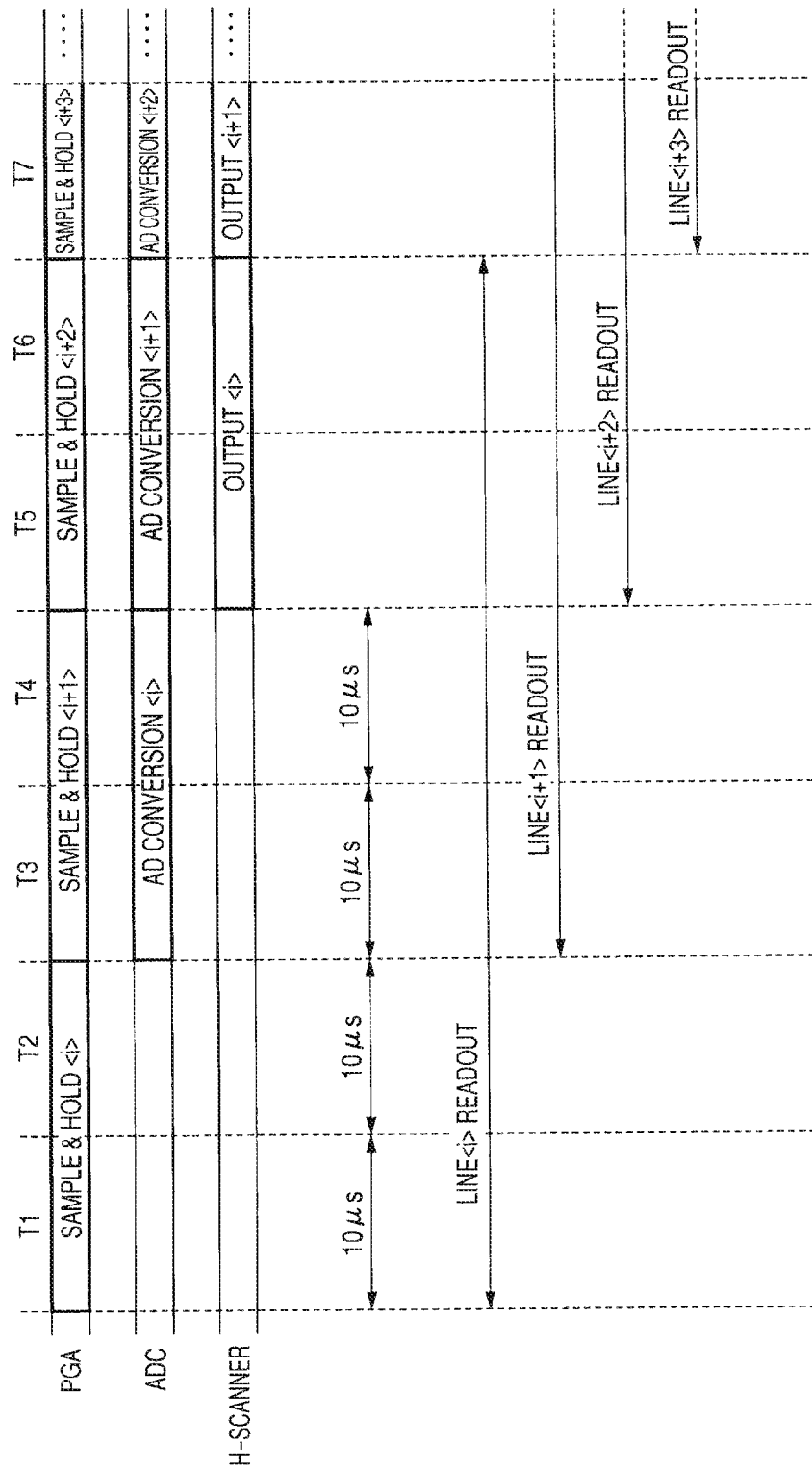
FIG. 16 is a diagram of assistance in explaining another example of the timing of each stage in the readout operation (pipeline system) of pixel information in the solid-state image pickup device according to the third embodiment of the invention.

FIG. 16 is a diagram of assistance in explaining another example of the timing of each stage in the readout operation (pipeline system) of pixel information in the solid-state image pickup device according to the third embodiment of the invention. In FIG. 16, the time required for the sample & hold stage is 20 µs, the time required for the AD conversion stage is 20 µs, and the time required for the data output stage is 20 µs.

In periods T1 to T2, the PGA 16 performs the sample & hold stage of pixel information in the ith row. In periods T3 to T4, the ADC 12 performs the AD conversion stage of pixel information in the ith row. Concurrently, in the periods T3 to T4, the PGA 16 performs the sample & hold stage of pixel information in the (i+1)th row.

In periods T5 to T6, the H-scanner 14 performs the data output stage of digitally converted pixel information in the ith row. Concurrently, in the periods T5 to T6, the ADC 12 performs the AD conversion stage of pixel information in the (i+1)th row, and the PGA 16 performs the sample & hold stage of pixel information in the (i+2)th row.

Thus, while the ADC 12 performs the AD conversion stage of pixel information in one row, the PGA 16 performs the sample & hold stage of pixel information in the next row. Accordingly, the readout time per row is apparently 20 µs, and the frame rate can be 12.5 frames/s (middle frame rate). This is the same as in the pipeline system described with reference to FIG. 15.

The pipeline system described with reference to FIG. 16 differs from that of FIG. 15 in that the time required for the sample & hold stage is 20 µs and the time required for the data output stage is 20 µs. Extending the time required for the sample & hold stage from 10 µs to 20 µs enables sufficient conversion of charge generated by photoelectric effect and stored in each pixel, which can improve the S/N ratio compared to the pipeline system shown in FIG. 15.

Further, extending the time required for the data output stage from 10 µs to 20 µs can decrease the reference clock frequency of the H-scanner 14, which can facilitate the design. Further, decreasing the reference clock frequency can also reduce noise that occurs in the H-scanner 14.

Using the pipeline systems shown in FIG. 15 and FIG. 16 can increase the frame rate as described above. However, since two or more stages of the sample & hold stage, the AD conversion stage, and the data output stage are always performed concurrently, noise that occurs in one stage could be transmitted to another stage proceeding concurrently. This noise could reduce the precision and cause a malfunction in the worst case.

Although sweeping generalizations cannot be made about noise immunity depending on the circuit system, specification, layout, and the like, the configuration in which noise is less likely to occur with the decreased frame rate as shown in FIG. 13 or the configuration in which noise is more likely to occur with the increased frame rate as shown in FIGS. 15 and 16 should be selected as appropriate.

As described above, according to the solid-state image pickup device of this embodiment, while the ADC 12 performs the AD conversion stage of pixel information in one row, the PGA 16 performs the sample & hold stage of pixel information in the next row, which enables higher-speed readout operation and the higher frame rate, in addition to the advantageous effects described in the first embodiment.

In the above embodiments, the potential of Vramp is decreased in a slope manner; however, the same advantageous effect can be obtained by increasing the potential of Vramp in a slope manner. That is, the potential of Vramp can be changed in a slope manner.

Next, other aspects of the invention will be described. As a result of further investigating the first to third embodiments, the following problem has become apparent.

Figure 17A:
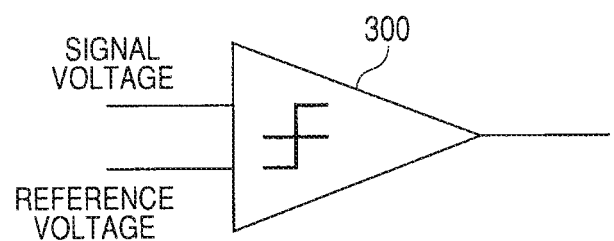
FIGS. 17A and 17B are diagrams of assistance in explaining a configuration example and the operation of an integral ADC.
Figure 17B:
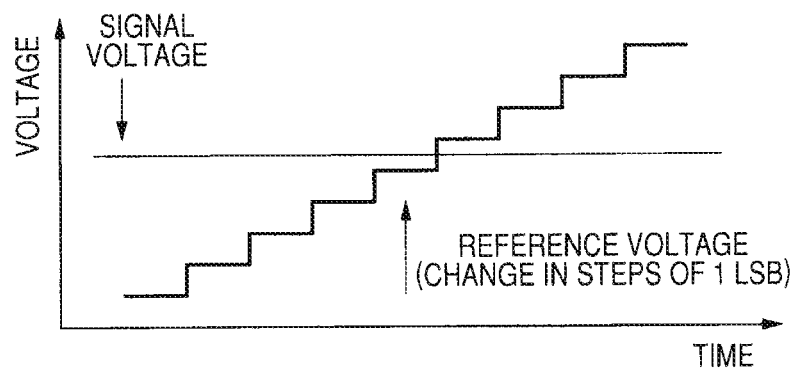

FIGS. 17A and 17B are diagrams of assistance in explaining a configuration example and the operation of an integral ADC. As shown in FIG. 17A, the integral ADC is comprised of a comparator 300, which receives a pixel signal as a signal voltage and compares it with a reference voltage for AD conversion.

After clearing the value of a counter at the initialization, the integral ADC starts the count-up of the counter. As shown in FIG. 17B, the reference voltage is changed in steps of 1 LSB (Least Significant Bit) from the minimum voltage or the maximum voltage to be increased or decreased in a stepwise manner. Further, the comparator 300 compares the signal voltage with the reference voltage, and the value of the counter when the comparison result is inverted becomes a digital value. Since the integral ADC performs such a comparison, a time proportional to $2^N$ (2 to the power of n) is required for AD conversion, where N is the ADC resolution.

Figure 18A:
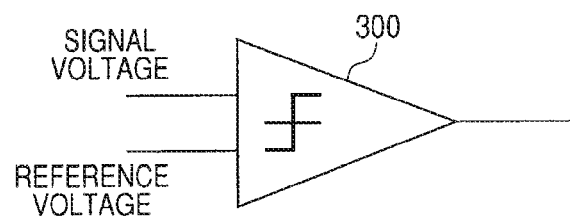
FIGS. 18A and 18B are diagrams of assistance in explaining a configuration example and the operation of a subrange ADC.
Figure 18B:
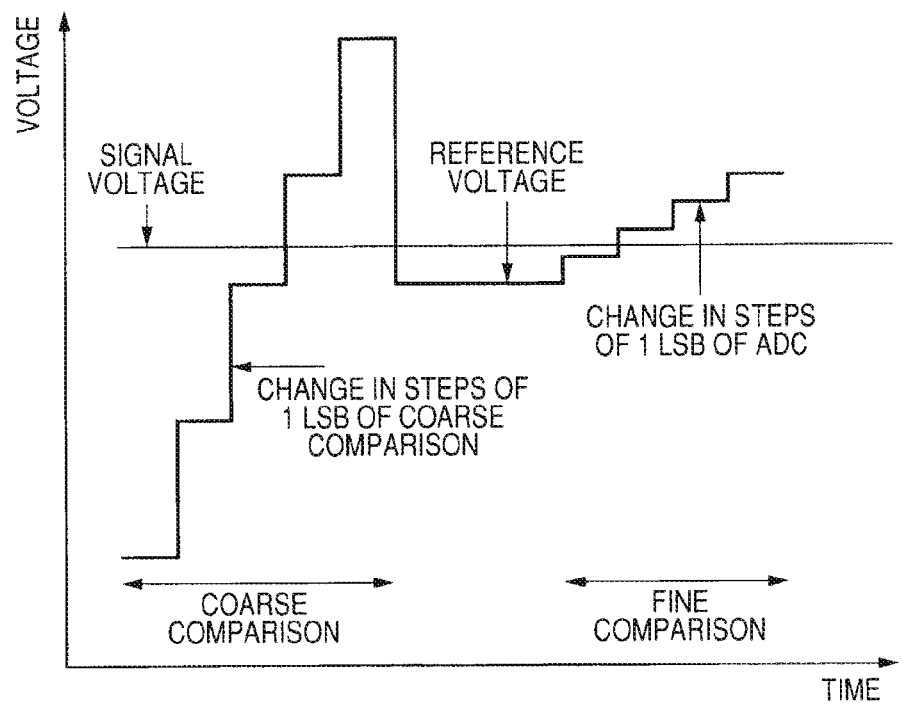

FIGS. 18A and 18B are diagrams of assistance in explaining a configuration example and the operation of a subrange ADC. As shown in FIG. 18A, the configuration of the subrange ADC is the same as that of the integral ADC shown in FIG. 17A.

In the subrange ADC, N bits of ADC resolution are divided into coarse bits (upper M bits) and fine bits (lower (N−M) bits) for comparisons by the comparator 300.

First, as shown in FIG. 18B, a coarse comparison is performed. At this time, the reference voltage is changed in steps of 1 LSB of the coarse bits from the minimum voltage or the maximum voltage. As shown in FIG. 18B, in the coarse comparison, the comparator 300 compares the signal voltage with the reference voltage, with the reference voltage being coarsely changed. Then, coarse bits are determined when the comparison result is inverted.

Next, a fine comparison is performed. At this time, the reference voltage is changed in steps of 1 LSB of the ADC (fine bits) in a region corresponding to the coarse bits determined in the coarse comparison. As shown in FIG. 18B, in the fine comparison, the comparator 300 compares the signal voltage with the reference voltage, with the reference voltage being finely changed. Then, fine bits are determined when the comparison result is inverted.

In the subrange ADC, the sum of the coarse bits and the fine bits becomes a digital value. Since the subrange ADC performs such a comparison, $2^M \times$ coarse comparison time + $2^{(N-M)} \times$ fine comparison time is required for AD conversion.

Fourth Embodiment

Figure 19:
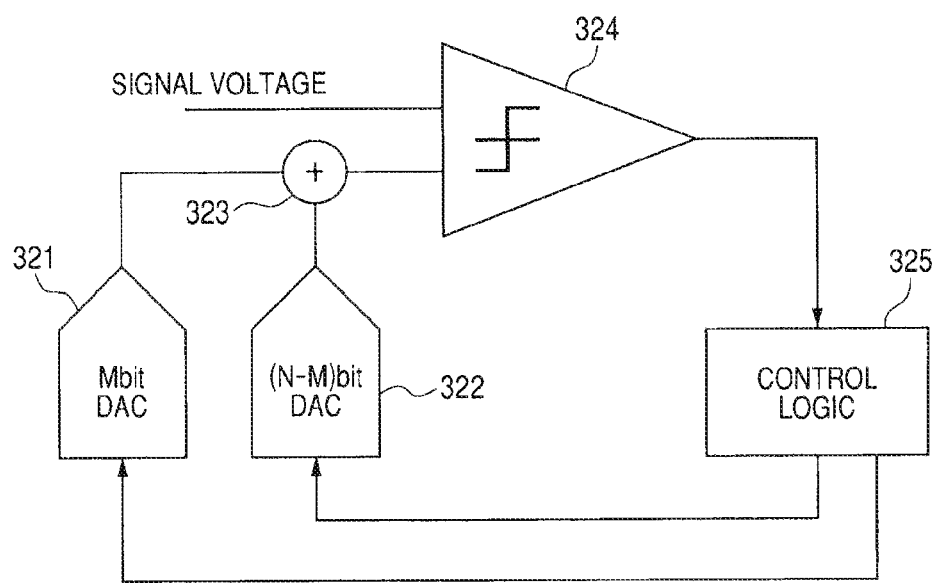
FIG. 19 is a diagram showing a configuration example of an ADC according to a fourth embodiment of the invention.

FIG. 19 is a diagram showing a configuration example of an ADC according to the fourth embodiment of the invention. The ADC includes an Mbit DAC 321, an (N−M)bit DAC 322, an adder 323, a comparator 324, and a control logic 325. In this embodiment, N bits of ADC resolution are divided into coarse bits (upper M bits) and fine bits (lower (N−M) bits), the Mbit DAC 321 performs a coarse comparison, and the (N−M)bit DAC 322 performs a fine comparison.

The adder 323 adds coarse bits outputted from the Mbit DAC 321 and fine bits outputted from the (N−M)bit DAC 322. The control logic 325 controls the coarse comparison by the Mbit DAC 321 and the fine comparison by the (N−M)bit DAC 322.

Figure 20:
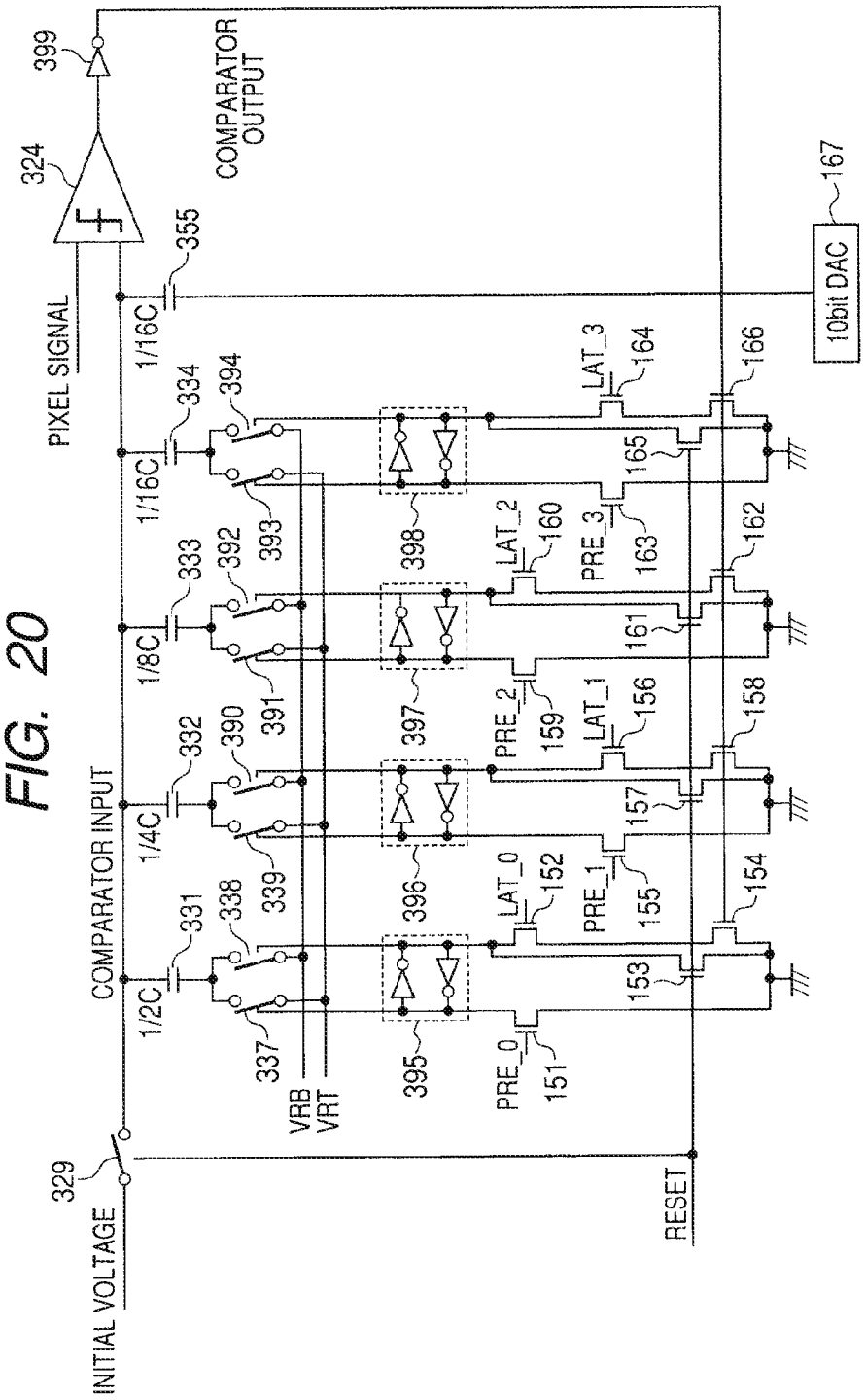
FIG. 20 is a diagram of assistance in explaining in further detail the configuration of the ADC shown in FIG. 19 according to the fourth embodiment.

FIG. 20 is a diagram of assistance in explaining in further detail the configuration of the ADC shown in FIG. 19 according to the fourth embodiment. The ADC includes the comparator 324, switches 329, 337 to 339, and 390 to 394, capacitors 331 to 335, holding circuits 395 to 398, an inverter 399, N-channel MOS transistors 151 to 166, and a 10 bit DAC 167.

The 10 bit DAC 167 correspond to the (N−M)bit DAC 322 shown in FIG. 19. The configuration thereof is not limited in particular.

The capacitor 331 is capacitively coupled to a comparator input line. A comparison for the most significant bit of the coarse bits is performed by switching the switches 337 and 338 coupled to the capacitor 331. The capacitance of the capacitor 331 is ½C.

The capacitor 332 is capacitively coupled to the comparator input line. A comparison for the second bit of the coarse bits is performed by switching the switches 339 and 390 coupled to the capacitor 332. The capacitance of the capacitor 332 is ¼C which is half that of the capacitor 331.

The capacitor 333 is capacitively coupled to the comparator input line. A comparison for the third bit of the coarse bits is performed by switching the switches 391 and 392 coupled to the capacitor 333. The capacitance of the capacitor 333 is ⅛C which is half that of the capacitor 332.

The capacitor 334 is capacitively coupled to the comparator input line. A comparison for the least significant bit of the coarse bits is performed by switching the switches 393 and 394 coupled to the capacitor 334. The capacitance of the capacitor 334 is 1/16C which is half that of the capacitor 333.

The capacitor 335 is capacitively coupled to the comparator input line, and the counter electrode is coupled to the 10 bit DAC 167. The capacitance of the capacitor 335 is 1/16C which is the same as that of the capacitor 334.

Control signals such as preset signals PRE_0 to PRE_3, latch signals LAT_0 to LAT_3, and a reset signal RESET are generated by the control logic 325 shown in FIG. 19, and supplied to the transistors 151 to 166.

Figure 21:
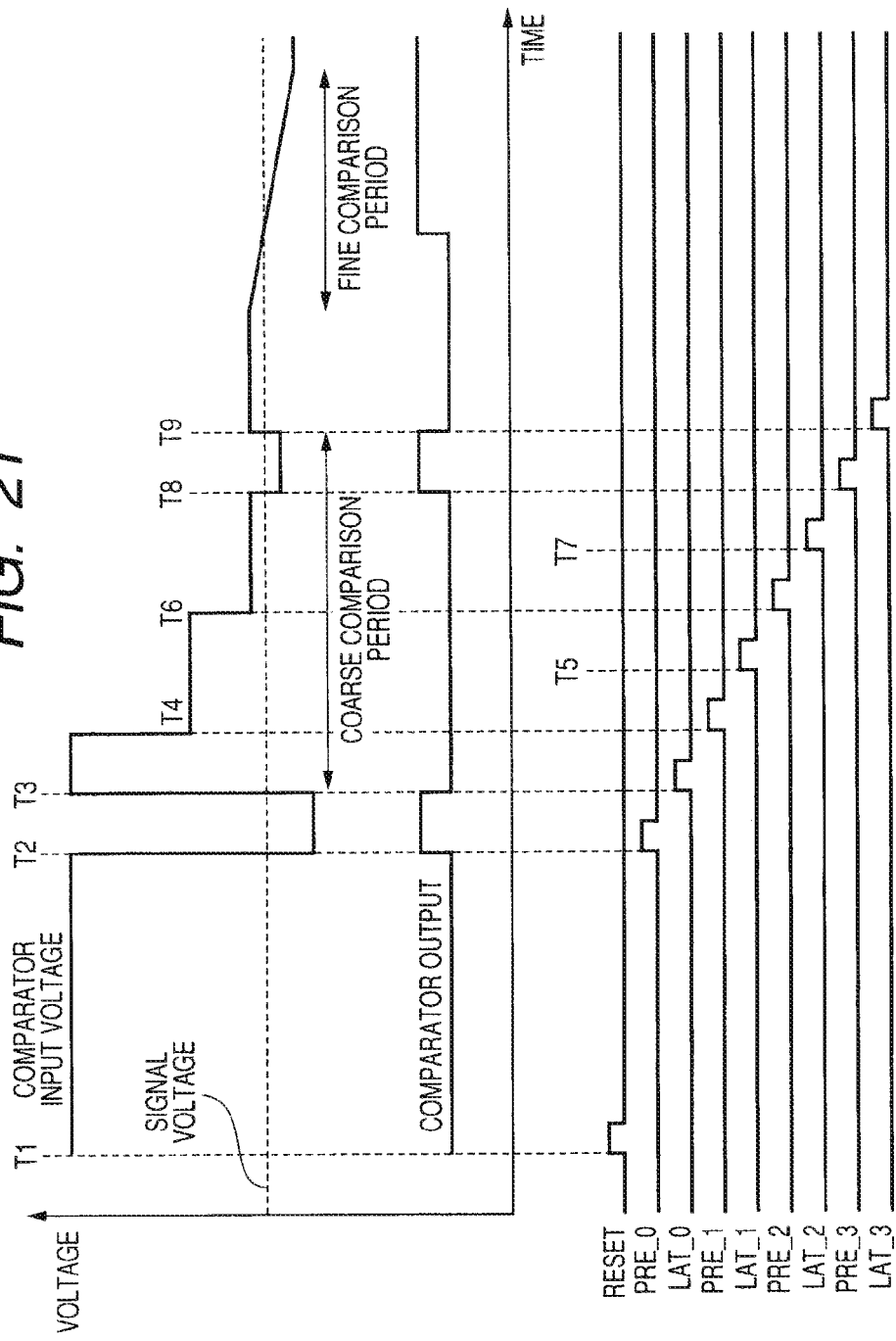
FIG. 21 is a timing chart of assistance in explaining the operation of the ADC according to the fourth embodiment of the invention.

FIG. 21 is a timing chart of assistance in explaining the operation of the ADC according to the fourth embodiment of the invention. First, at a time T1, the reset signal RESET becomes the H level, so that the switch 329 and the transistors 153, 157, 161, and 165 enter the ON state. At this time, an initial voltage is supplied to the comparator input line, and the holding circuits 395 to 398 hold the L level at the right terminals and the H level at the left terminals. As a result, the switches 337, 339, 391, and 393 enter the ON state, and the switches 338, 390, 392, and 394 enter the OFF state, so that a voltage VRT is coupled to the capacitors 331 to 334.

At a time T2, the preset signal PRE_0 becomes the H level, and the transistor 151 enters the ON state, so that the holding circuit 395 holds the H level at the right terminal and the L level at the left terminal. As a result, the switch 337 enters the OFF state, and the switch 338 enters the ON state, so that a voltage VRB is coupled to the capacitor 331. At this time, the voltage of the comparator input line decreases by (VRT−VRB)/2.

Since the comparator input voltage becomes lower than the signal voltage, the comparator 324 outputs the L level, and the comparator output which is the output of the inverter 399 becomes the H level. As a result, the transistor 154 enters the ON state.

At a time T3, the latch signal LAT_0 becomes the H level, and the transistor 152 enters the ON state. At this time, the transistor 154 is also in the ON state, so that the holding circuit 395 holds the L level at the right terminal and the H level at the left terminal. As a result, the switch 337 enters the ON state, and the switch 338 enters the OFF state, so that the voltage VRT is again coupled to the capacitor 331. The holding circuit 395 holds the value "0" at the right terminal.

At a time T4, the preset signal PRE_1 becomes the H level, and the transistor 155 enters the ON state, so that the holding circuit 396 holds the H level at the right terminal and the L level at the left terminal. As a result, the switch 339 enters the OFF state, and the switch 390 enters the ON state, so that the voltage VRB is coupled to the capacitor 332. At this time, the voltage of the comparator input line decreases by (VRT−VRB)/4.

Since the comparator input voltage is higher than the signal voltage, the comparator 324 outputs the H level, and the comparator output which is the output of the inverter 399 remains at the L level. As a result, the transistor 158 remains in the OFF state.

At a time T5, the latch signal LAT_1 becomes the H level, and the transistor 156 enters the ON state. At this time, the transistor 158 is in the OFF state, so that the holding circuit 396 holds the H level at the right terminal and the L level at the left terminal. As a result, the switch 339 remains in the OFF state, and the switch 390 remains in the ON state, so that the voltage VRB is still coupled to the capacitor 332. The holding circuit 396 holds the value "1" at the right terminal.

At a time T6, the preset signal PRE_2 becomes the H level, and the transistor 159 enters the ON state, so that the holding circuit 397 holds the H level at the right terminal and the L level at the left terminal. As a result, the switch 391 enters the OFF state, and the switch 392 enters the ON state, so that the voltage VRB is coupled to the capacitor 333. At this time, the voltage of the comparator input line decreases by (VRT−VRB)/8.

Since the comparator input voltage is higher than the signal voltage, the comparator 324 outputs the H level, and the comparator output which is the output of the inverter 399 remains at the L level. As a result, the transistor 162 remains in the OFF state.

At a time T7, the latch signal LAT_2 becomes the H level, and the transistor 160 enters the ON state. At this time, the transistor 162 is in the OFF state, so that the holding circuit 397 holds the H level at the right terminal and the L level at the left terminal. As a result, the switch 391 remains in the OFF state, and the switch 392 remains in the ON state, so that the voltage VRB is still coupled to the capacitor 333. The holding circuit 397 holds the value "1" at the right terminal.

At a time T8, the preset signal PRE_3 becomes the H level, and the transistor 163 enters the ON state, so that the holding circuit 398 holds the H level at the right terminal and the L level at the left terminal. As a result, the switch 393 enters the OFF state, and the switch 394 enters the ON state, so that the voltage VRB is coupled to the capacitor 334. At this time, the voltage of the comparator input line decreases by (VRT−VRB)/16.

Since the comparator input voltage becomes lower than the signal voltage, the comparator 324 outputs the L level, and the comparator output which is the output of the inverter 399 becomes the H level. As a result, the transistor 166 enters the ON state.

At a time T9, the latch signal LAT_3 becomes the H level, and the transistor 164 enters the ON state. At this time, the transistor 166 is also in the ON state, so that the holding circuit 398 holds the L level at the right terminal and the H level at the left terminal. As a result, the switch 393 enters the ON state, and the switch 384 enters the OFF state, so that the voltage VRT is again coupled to the capacitor 334. The holding circuit 398 holds the value "0" at the right terminal.

In this way, the values "0110" held by the holding circuits 395 to 398 are determined as coarse bits. After that, the (N−M)bit DAC 322 is controlled to perform a fine comparison and determine fine bits. The determined coarse bits and fine bits are sequentially transferred in the horizontal direction by the H-scanner 14 shown in FIG. 3.

In the above description, the comparator input voltage is sequentially decreased from the initial voltage by the voltage corresponding to each bit of the coarse bits. However, the comparator input voltage may be sequentially increased from the initial voltage by the voltage corresponding to each bit of the coarse bits.

As described above, the solid-state image pickup device of this embodiment performs successive approximation (binary search) in which the comparator input voltage is sequentially decreased or increased from the initial voltage by the voltage corresponding to each bit of the coarse bits and the comparator 324 compares the comparator input voltage with the signal voltage to determine each bit of the coarse bits. Therefore, the time required for AD conversion is M×coarse comparison time+$2^{(N-M)}$×fine comparison time, so that AD conversion can be performed at high speed.

Fifth Embodiment

Figure 22:
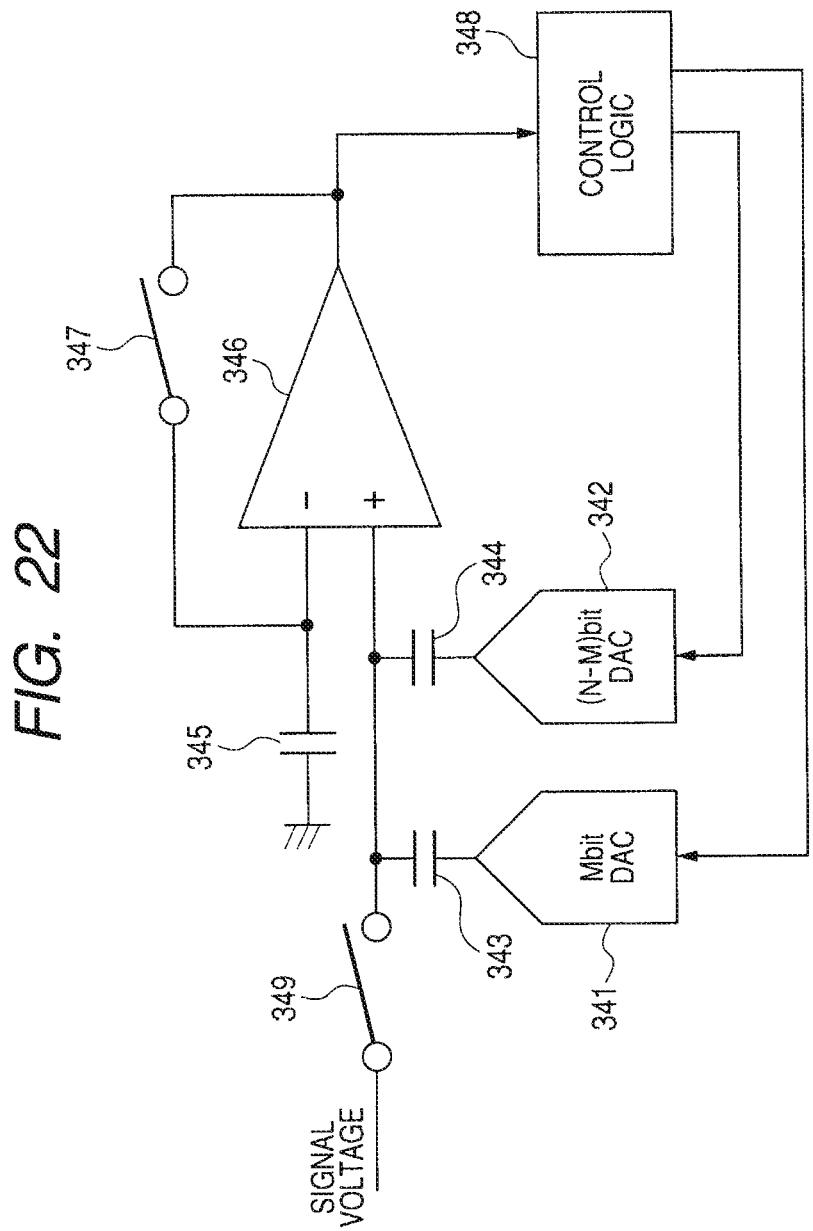
FIG. 22 is a diagram showing a configuration example of an ADC according to a fifth embodiment of the invention.

FIG. 22 is a diagram showing a configuration example of an ADC according to the fifth embodiment of the invention. The ADC includes an Mbit DAC 341, an (N−M)bit DAC 342, capacitors 343 to 345, a high-gain amplifier 346, switches 347 and 349, and a control logic 348. In this embodiment as well, N bits of ADC resolution are divided into coarse bits (upper M bits) and fine bits (lower (N−M) bits), the Mbit DAC 341 performs a coarse comparison, and the (N−M)bit DAC 342 performs a fine comparison.

Figure 23:
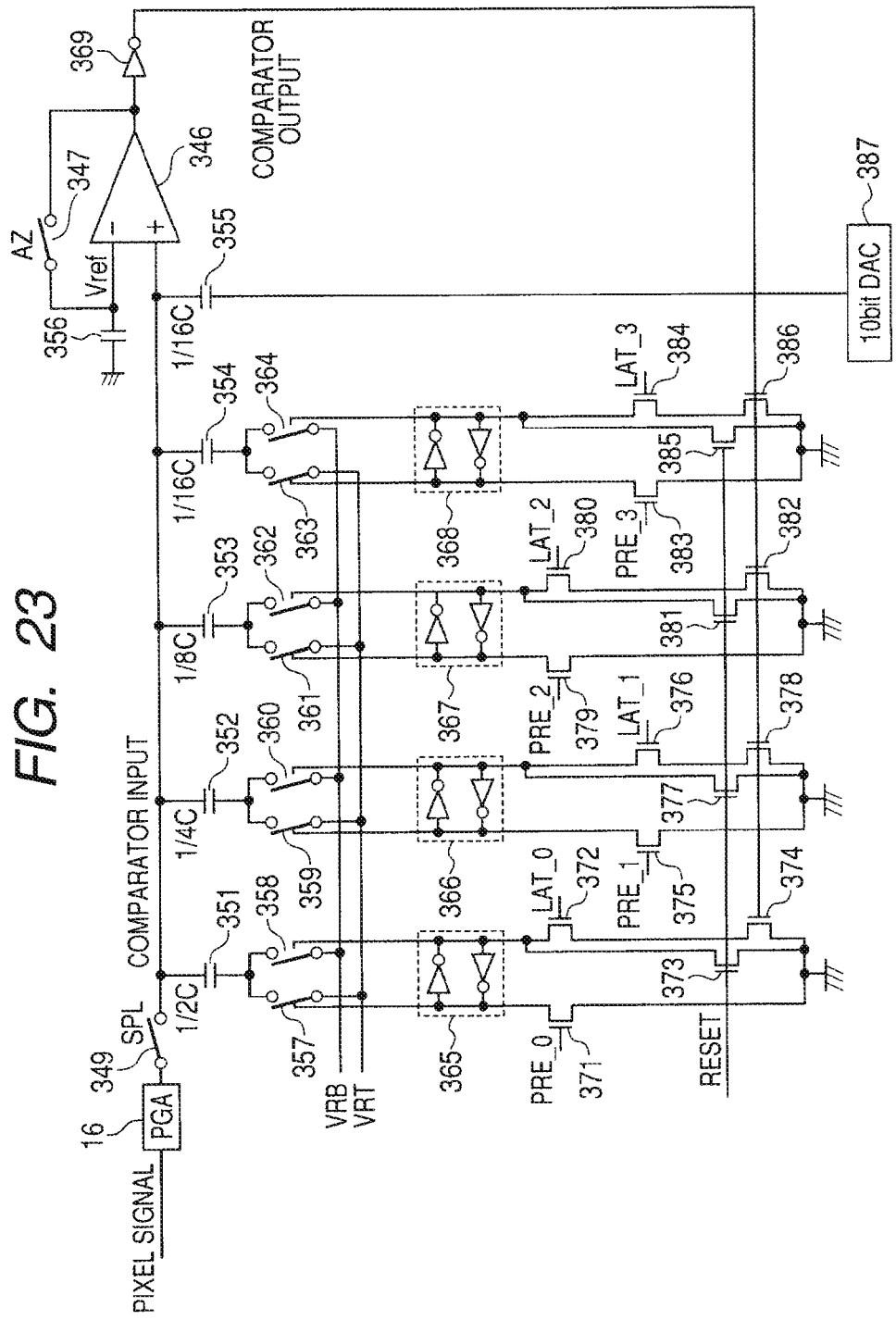
FIG. 23 is a diagram of assistance in explaining in further detail the configuration of the ADC shown in FIG. 22 according to the fifth embodiment.

FIG. 23 is a diagram of assistance in explaining in further detail the configuration of the ADC shown in FIG. 22 according to the fifth embodiment. The ADC includes the high-gain amplifier 346, switches 347, 349, and 357 to 364, capacitors 351 to 356, holding circuits 365 to 368, an inverter 369, N-channel MOS transistors 371 to 386, and a 10 bit DAC 387.

The 10 bit DAC 387 correspond to the (N−M)bit DAC 342 shown in FIG. 22. The configuration thereof is not limited in particular.

The amplified pixel input outputted from the PGA 16 is coupled to the positive input of the high-gain amplifier 346 through the switch 349. The negative input of the high-gain amplifier 346 is coupled to the output of the high-gain amplifier 346 through the switch 347, and coupled to the capacitor 356 for holding information on the dark state of the pixel (pixel information at the time of non-exposed).

The capacitor 351 is capacitively coupled to a comparator input line. A comparison for the most significant bit of the coarse bits is performed by switching the switches 357 and 358 coupled to the capacitor 351. The capacitance of the capacitor 351 is ½C.

The capacitor 352 is capacitively coupled to the comparator input line. A comparison for the second bit of the coarse bits is performed by switching the switches 359 and 360 coupled to the capacitor 352. The capacitance of the capacitor 352 is ¼C which is half that of the capacitor 351.

The capacitor 353 is capacitively coupled to the comparator input line. A comparison for the third bit of the coarse bits is performed by switching the switches 361 and 362 coupled to the capacitor 353. The capacitance of the capacitor 353 is ⅛C which is half that of the capacitor 352.

The capacitor 354 is capacitively coupled to the comparator input line. A comparison for the least significant bit of the coarse bits is performed by switching the switches 363 and 364 coupled to the capacitor 354. The capacitance of the capacitor 354 is ¹⁄₁₆C which is half that of the capacitor 353.

The capacitor 355 is capacitively coupled to the comparator input line, and the counter electrode is coupled to the 10 bit DAC 387. The capacitance of the capacitor 355 is ¹⁄₁₆C which is the same as that of the capacitor 354.

Control signals such as PRE_0 to PRE_3, LAT_0 to LAT_3, and RESET are generated by the control logic 348 shown in FIG. 22, and supplied to the transistors 371 to 386.

Figure 24:
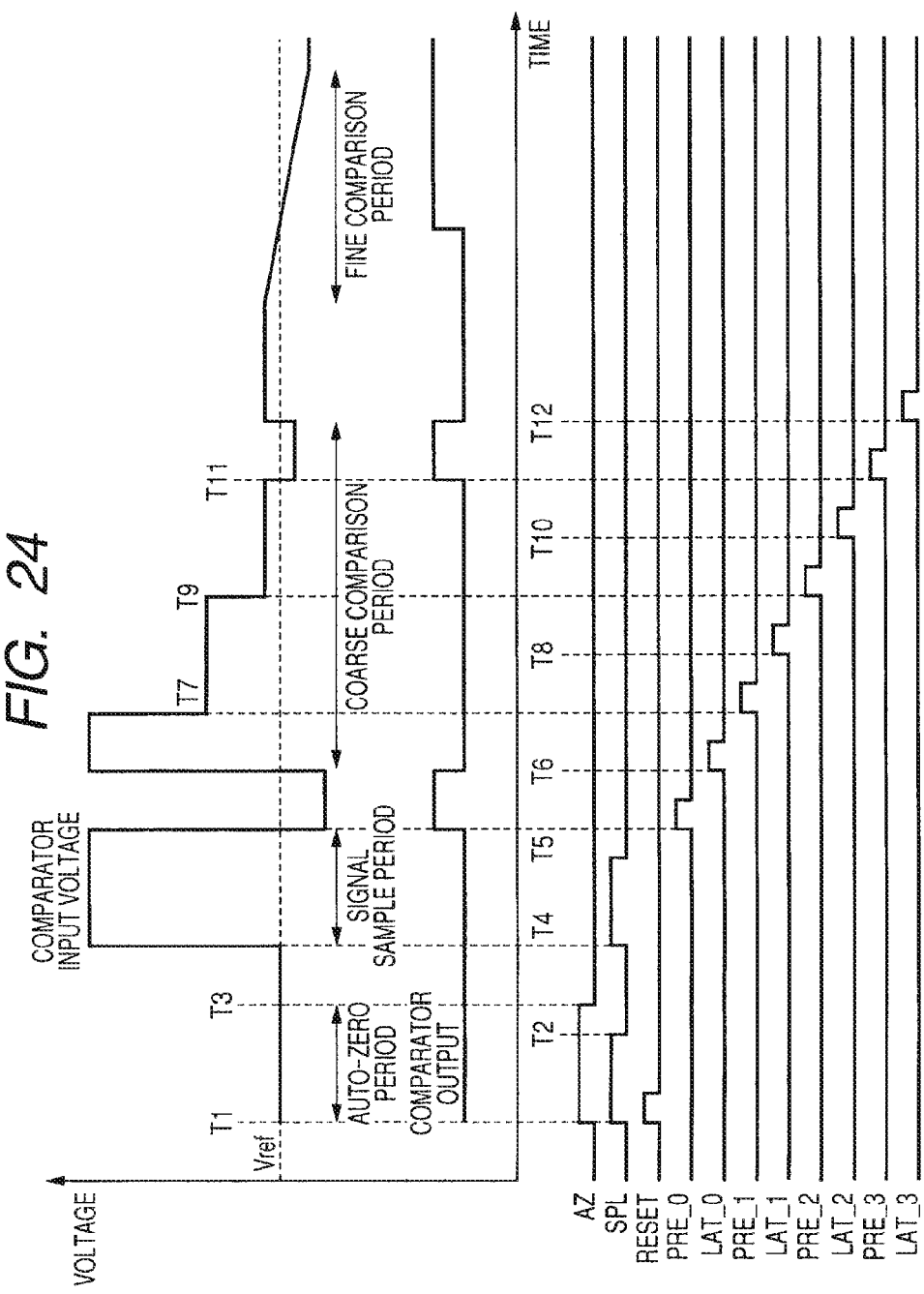
FIG. 24 is a timing chart of assistance in explaining the operation of the ADC according to the fifth embodiment of the invention.

FIG. 24 is a timing chart of assistance in explaining the operation of the ADC according to the fifth embodiment of the invention. First, at a time T1, an auto-zero signal AZ and a sampling signal SPL become the H level, and the switches 347 and 349 enter the ON state. At this time, information on the dark state of the pixel is sampled on the comparator input line. The high-gain amplifier 346 provides the potential of information on the dark state of the pixel at the positive electrode (Vref) of the capacitor 356.

Further, at a time T1, the signal RESET becomes the H level, and the transistors 373, 377, 381, and 385 enter the ON state. At this time, the holding circuits 365 to 368 hold the L level at the right terminals and the H level at the left terminals. As a result, the switches 357, 359, 361, and 363 enter the ON state, and the switches 358, 360, 362, and 364 enter the OFF state, so that a voltage VRT is coupled to the capacitors 351 to 354.

At a time T2, the signal SPL become the L level, and information on the dark state of the pixel is held on the comparator input line. Further, at a time T3, the signal AZ become the L level, and the potential of information on the dark state of the pixel is held at the positive electrode (Vref) of the capacitor 356.

At a time T4, the signal SPL become the H level again, and the potential of information on the light state of the pixel (pixel information at the time of exposed) outputted from the PGA 16 is sampled and held on the comparator input line.

At a time T5, the signal PRE_0 becomes the H level, and the transistor 371 enters the ON state, so that the holding circuit 365 holds the H level at the right terminal and the L level at the left terminal. As a result, the switch 357 enters the OFF state, and the switch 358 enters the ON state, so that a voltage VRB is coupled to the capacitor 351. At this time, the voltage of the comparator input line decreases by (VRT−VRB)/2.

Since the comparator input voltage becomes lower than the reference voltage Vref, the high-gain amplifier 346 outputs the L level, and the comparator output which is the output of the inverter 369 becomes the H level. As a result, the transistor 374 enters the ON state.

At a time T6, the signal LAT_0 becomes the H level, and the transistor 372 enters the ON state. At this time, the transistor 374 is also in the ON state, so that the holding circuit 365 holds the L level at the right terminal and the H level at the left terminal. As a result, the switch 357 enters the ON state, and the switch 358 enters the OFF state, so that the voltage VRT is again coupled to the capacitor 351. The holding circuit 365 holds the value "0" at the right terminal.

At a time T7, the signal PRE_1 becomes the H level, and the transistor 375 enters the ON state, so that the holding circuit 366 holds the H level at the right terminal and the L level at the left terminal. As a result, the switch 359 enters the OFF state, and the switch 360 enters the ON state, so that the voltage VRB is coupled to the capacitor 352. At this time, the voltage of the comparator input line decreases by (VRT−VRB)/4.

Since the comparator input voltage is higher than the reference voltage Vref, the high-gain amplifier 346 outputs the H level, and the comparator output which is the output of the inverter 369 remains at the L level. As a result, the transistor 378 remains in the OFF state.

At a time T8, the signal LAT_1 becomes the H level, and the transistor 376 enters the ON state. At this time, the transistor 378 is in the OFF state, so that the holding circuit 366 holds the H level at the right terminal and the L level at the left terminal. As a result, the switch 359 remains in the OFF state, and the switch 360 remains in the ON state, so that the voltage VRB is still coupled to the capacitor 352. The holding circuit 366 holds the value "1" at the right terminal.

At a time T9, the signal PRE_2 becomes the H level, and the transistor 379 enters the ON state, so that the holding circuit 367 holds the H level at the right terminal and the L level at the left terminal. As a result, the switch 361 enters the OFF state, and the switch 362 enters the ON state, so that the voltage VRB is coupled to the capacitor 353. At this time, the voltage of the comparator input line decreases by (VRT−VRB)/8.

Since the comparator input voltage is higher than the reference voltage Vref, the high-gain amplifier 346 outputs the H level, and the comparator output which is the output of the inverter 369 remains at the L level. As a result, the transistor 382 remains in the OFF state.

At a time T10, the signal LAT_2 becomes the H level, and the transistor 380 enters the ON state. At this time, the transistor 382 is in the OFF state, so that the holding circuit 367 holds the H level at the right terminal and the L level at the left terminal. As a result, the switch 361 remains in the OFF state, and the switch 362 remains in the ON state, so that the voltage VRB is still coupled to the capacitor 353. The holding circuit 367 holds the value "1" at the right terminal.

At a time T11, the signal PRE_3 becomes the H level, and the transistor 383 enters the ON state, so that the holding circuit 368 holds the H level at the right terminal and the L level at the left terminal. As a result, the switch 363 enters the OFF state, and the switch 364 enters the ON state, so that the voltage VRB is coupled to the capacitor 354. At this time, the voltage of the comparator input line decreases by (VRT−VRB)/16.

Since the comparator input voltage becomes lower than the reference voltage Vref, the high-gain amplifier 346 outputs the L level, and the comparator output which is the output of the inverter 369 becomes the H level. As a result, the transistor 386 enters the ON state.

At a time T12, the signal LAT_3 becomes the H level, and the transistor 384 enters the ON state. At this time, the transistor 386 is also in the ON state, so that the holding circuit 368 holds the L level at the right terminal and the H level at the left terminal. As a result, the switch 363 enters the ON state, and the switch 364 enters the OFF state, so that the voltage VRT is again coupled to the capacitor 354. The holding circuit 368 holds the value "0" at the right terminal.

In this way, the values "0110" held by the holding circuits 365 to 368 are determined as coarse bits. After that, the (N−M)bit DAC 342 is controlled to perform a fine comparison and determine fine bits. The determined coarse bits and fine bits are sequentially transferred in the horizontal direction by the H-scanner 14 shown in FIG. 3.

In the above description, the comparator input voltage is sequentially decreased from the pixel signal voltage by the voltage corresponding to each bit of the coarse bits. However, the comparator input voltage may be sequentially increased from the pixel signal voltage by the voltage corresponding to each bit of the coarse bits.

As described above, the solid-state image pickup device of this embodiment performs successive approximation (binary search) in which the comparator input voltage sequentially decreases or increases from the pixel signal voltage by the voltage corresponding to each bit of the coarse bits and the high-gain amplifier 346 compares the comparator input voltage with the reference voltage Vref to determine each bit of the coarse bits. Therefore, the time required for AD conversion is M×coarse comparison time+$2^{(N-M)}$×fine comparison time, so that AD conversion can be performed at high speed.

Sixth Embodiment

In the solid-state image pickup device according to the fourth and fifth embodiments of the invention, the Mbit DAC 321 or 341 performs the 4-bit coarse comparison, and the (N−M)bit DAC 322 or 342 performs the 10-bit fine comparison.

In a solid-state image pickup device according to the sixth embodiment of the invention, the (N−M)bit DAC 322 or 342 is comprised of, e.g., a 10.2-bit over-range DAC. This embodiment differs only in that a digital value is obtained by subtracting a value corresponding to over-range at the time of adding coarse bits determined by the Mbit DAC 321 or 341 and fine bits determined by the (N−M)bit DAC 322 or 342. Therefore, detailed description of overlapping configurations and functions will not be repeated.

As described above, according to the solid-state image pickup device of this embodiment, the (N−M)bit DAC is comprised of the over-range DAC, which can facilitate the connection correction between sub-ranges, in addition to the advantageous effects described in the fourth and fifth embodiments.

The present embodiments are to be considered in all respects as illustrative and not restrictive. The scope of the invention is defined by the appended claims instead of the foregoing description, and all changes that come within the scope of the claims and the meaning and range of equivalents are intended to be embraced therein.

What is claimed is:

1. A digital to analog conversion method by a solid-state image pickup device, the method comprising the steps of:
   by an image pickup, in which a plurality of pixels each including a photoelectric conversion element for converting an optical signal into an electrical signal are arranged in a matrix, sequentially scanning pixels in each row and outputting pixel signals of a selected row through a plurality of vertical readout lines arranged in respective columns; and
   by each of a plurality of converters, converting a pixel signal outputted through a corresponding vertical readout line from an analog signal to a digital value, wherein:
   the converting step performed by each converter includes:
      by a comparison circuit having a comparator input node, a reference voltage node and an output node, included in each converter, comparing voltages of the comparator input node and the reference voltage node, and outputting a comparison result to the output node;
      by a sample and hold circuit included in each converter, sampling and holding a voltage of the pixel signal outputted through the vertical readout line, and outputting the voltage of the pixel signal to the comparator input node;
      by a first determination circuit including a plurality of circuit units, included in each converter, changing the voltage of the comparator input node by voltages respectively corresponding to upper bits of the digital value, and determining each bit of the upper bits in accordance with the comparison result; and
      by a second determination circuit included in each converter, determining lower bits of the digital value in accordance with the reference voltage and the upper bits determined by the first determination circuit,
   wherein the step performed by the first determination circuit including the plurality of circuit units comprises:
      by a holding circuit having a pair of data holding lines, in each circuit unit, holding a data; and
      by a switching circuit in each circuit unit, receiving the comparison result and switching a state of the data, and
   wherein the step performed by the second determination circuit comprises:
      by a capacitive element coupled to the comparator input node and a control circuit coupled to the capacitive element, included in the first determination circuit, changing a voltage of the comparator input node in a step manner; and
      by a counter circuit in the second determination circuit, counting a comparison time accordance with the comparison result and determining the lower bits of the digital value in accordance with the comparison time.

2. The digital to analog conversion method according to claim 1, wherein the first determination circuit further includes:
   a first capacitive element having a first capacitance and coupling the comparator input node to the one of the plurality of the circuit unit; and
   a second capacitive element having a second capacitance and coupling the comparator input node to another one of the plurality of the circuit units, the second capacitance being half the capacitance of the first capacitive element, wherein
   the step performed by the first determination circuit further comprises:
      by the one of the plurality of the circuit units, changing a voltage of an electrode of the first capacitive element from a first voltage to a second voltage and holding the comparison result,
      by the another one of the circuit units, changing a voltage of an electrode of the second capacitive element from the first voltage to the second voltage and holding the comparison result.

3. The digital to analog conversion method according to claim 1, wherein the second determination circuit is configured of an over-range digital-to-analog converter.

4. The digital to analog conversion method according to claim 2, wherein the second determination circuit is configured of an over-range digital-to-analog converter.

* * * * *